(12) United States Patent
Venca et al.

(10) Patent No.: US 9,654,130 B2
(45) Date of Patent: May 16, 2017

(54) ANALOG-TO-DIGITAL CONVERTERS FOR SUCCESSIVE APPROXIMATION INCORPORATING DELTA SIGMA ANALOG-TO-DIGITAL CONVERTERS AND HYBRID DIGITAL-TO-ANALOG WITH CHARGE-SHARING AND CHARGE REDISTRIBUTION

(71) Applicant: Marvell World Trade Ltd., St. Michael (BB)

(72) Inventors: Alessandro Venca, Tortona (IT); Claudio Nani, Milan (IT); Nicola Ghittori, San Genesio ed Uniti (IT); Alessandro Bosi, Gadesco (IT)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 15/210,308

(22) Filed: Jul. 14, 2016

(65) Prior Publication Data
US 2017/0012633 A1    Jan. 12, 2017

Related U.S. Application Data

(63) Continuation of application No. 15/210,051, filed on Jul. 14, 2016, which is a continuation of application No. 15/204,365, filed on Jul. 7, 2016.
(Continued)

(51) Int. Cl.
*H03M 1/00* (2006.01)
*H03M 1/08* (2006.01)
(Continued)

(52) U.S. Cl.
CPC ........... *H03M 1/08* (2013.01); *H03M 1/1009* (2013.01); *H03M 1/1245* (2013.01); *H03M 1/38* (2013.01); *H03M 1/466* (2013.01); *H03M 3/322* (2013.01)

(58) Field of Classification Search
CPC ...... H03M 1/08; H03M 1/1009; H03M 1/466; H03M 3/322; H03M 1/38; H03M 1/1245
(Continued)

(56) References Cited

U.S. PATENT DOCUMENTS

| 5,140,538 A | 8/1992 | Bass et al. |
| 5,764,172 A | 6/1998 | Rodal |

(Continued)

FOREIGN PATENT DOCUMENTS

KR    20090022980 A    3/2009

OTHER PUBLICATIONS

Shuo-Wei Michael Chen et al.; "A 6-bit 600-MS/s 5.3-mW Asynchronous ADC in 0.13μm CMOS"; IEEE Journal of Solid-State Circuits, vol. 41, No. 12; Dec. 2006; pp. 2669-2680.
(Continued)

*Primary Examiner* — Brian Young

(57) ABSTRACT

An A/D converter including a sample and hold circuit, first and second A/D converters and a combination circuit. The sample and hold circuit samples an analog input signal to generate bits. The first A/D converter generate a first digital signal based on the analog input signal and includes charge-sharing and charge-redistribution D/A converters that convert respectively a most-significant-bit and a first least significant bit. The first digital signal is generated based on outputs of the charge-sharing and charge redistribution D/A converters. The second A/D converter generates a second digital signal based on an output of the first A/D converter and includes a delta sigma D/A converter, which converts a second least significant bit. The second digital signal is generated based on an output of the delta sigma D/A converter. The second A/D converter is a fine conversion A/D converter relative to the first A/D converter.

20 Claims, 11 Drawing Sheets

Related U.S. Application Data

(60) Provisional application No. 62/189,872, filed on Jul. 8, 2015, provisional application No. 62/234,148, filed on Sep. 29, 2015, provisional application No. 62/200,823, filed on Aug. 4, 2015.

(51) Int. Cl.
*H03M 1/12* (2006.01)
*H03M 1/38* (2006.01)
*H03M 1/10* (2006.01)
*H03M 3/00* (2006.01)
*H03M 1/46* (2006.01)

(58) Field of Classification Search
USPC .......................................... 341/122, 155, 118
See application file for complete search history.

(56) References Cited

U.S. PATENT DOCUMENTS

| | | | | |
|---|---|---|---|---|
| 7,812,757 B1* | 10/2010 | Wong | ................... | H03M 1/468 |
| | | | | 341/155 |
| 8,004,448 B2* | 8/2011 | Carreau | .................. | H03M 1/14 |
| | | | | 341/156 |
| 8,461,885 B2 | 6/2013 | Nguyen et al. | | |
| 8,581,824 B2 | 11/2013 | Baek et al. | | |
| 8,928,518 B1* | 1/2015 | Stepanovic | ........... | H03M 1/466 |
| | | | | 341/163 |

OTHER PUBLICATIONS

Yong Lim et al; "A 1mW 71.5dB SNDR 50MS/s 13b Fully Differential Ring-Amplifier-Based SAR-Assisted Pipeline ADC"; ISSCC 2015 / Session 26 / Nyquist-Rate Converters / 26.1; 2015 IEEE International Solid-State Circuits Conference; Feb. 25, 2015; 3 pages.

Frank van der Goes et al.; "A 1.5mW 68dB SNDR 80MS/s 2x Interleaved SAR-Assisted Pipelined ADC in 28nm CMOS"; ISSCC 2014 / Session 11 / Data Converter Techniques / 11.4; 2014 IEEE International Solid-State Circuits Conference; Feb. 11, 2014; 3 pages.

Boris Murmann; "ADC Performance Survey 1997-2015"; Stanford University; http://web.stanford.edu/~murmann/adcsurvey.html; 74 pages.

V. Hariprasath et al.; "Merged Capacitor Switching Based SAR ADC with Highest Switching Energy-Efficiency"; Electronic Letters, vol. 46, No. 9; Apr. 29, 2010; 2 pages.

Bob Verbruggen et al.; "A 70 dB SNDR 200 MS/s 2.3 mW Dynamic Pipelined SAR ADC in 28nm Digital CMOS"; Symposium on VLSI Circuits Diges of Technical Papers; 2014; 2 pages.

Kostas Doris et al; "A 480mW 2.6Gs/s 10b 65nm CMOS Time-Interleaved ADC with 48.5dB SNDR up to Nyquist"; ISSCC 2011/ Session 10 / Nyquist-Rate Converters / 10.1; IEEE International Solid-State Circuits Conference; Feb. 22, 2011; 3 pages.

Jan Craninckx et al.; "A 65fJ/Conversion-Step 0-to-50MS/s 0-to-0.7mW 9b Charge-Sharing SAR ADC in 90nm Digital CMOS"; ISSCC 2007 / Session 13 / ?? ADCs and Converter Techniques / 13.5; IEEE International Solid-State Circuits Conference; Feb. 13, 2007; 3 pages.

Wenbo Liu et al; "A 600MS/s 30mW 0.13 μm CMOS ADC Array Achieving Over 60dB SFDR with Adaptive Digital Equalization"; ISSCC 2009 / Session 4 / High-Speed Data Converters / 4.5; 2009 IEEE International Solid-State Circuits Conference; Feb. 9, 2009; 3 pages.

Jen-Huan Tsai et al.; "A 1-V, 8b, 40MS/s, 113μW Charge-Recycling Sar ADC with a 14μW Asynchronous Controller"; VLSI Circuits (VLSIC), 2011 Symposium On, IEEE, Jun. 15, 2011; pp. 264-265.

Alessandro Venco et al.; "A 0.076 mm2 12 b 26.5 mW 600 MS/s 4-Way Interleaved Subranging SAR-Dà ADC With On-Chip Buffer in 28 nm CMOS"; IEEE Journal of Solid-State Circuits; Jan. 1, 2016; pp. 1-12.

Invitation to Pay Additional Fees and, Where Applicable, Protest Fee for PCT Application No. PCT/IB2016/054124 mailed Nov. 7, 2016; 10 pages.

* cited by examiner

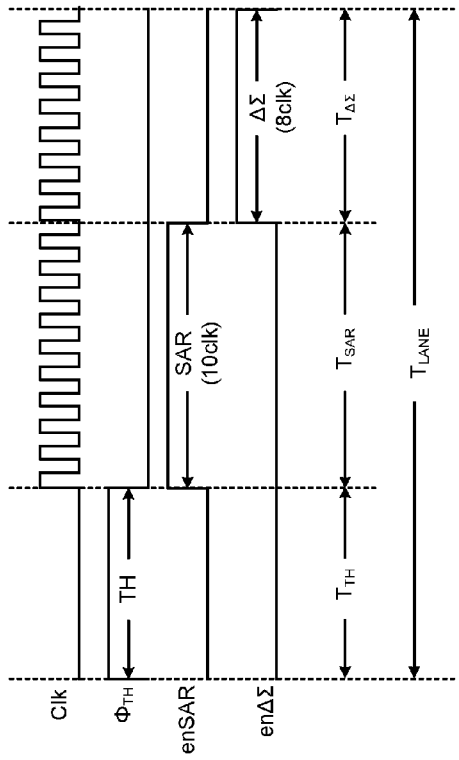
FIG. 6
FIG. 7
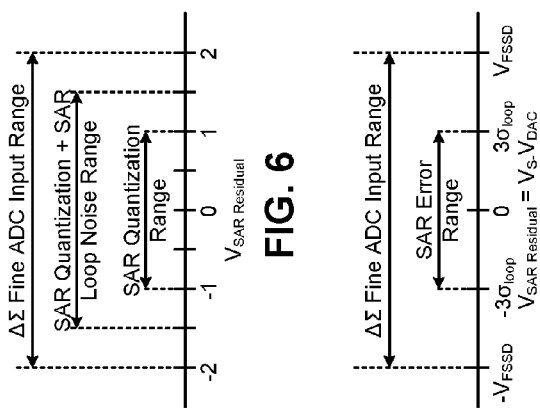
FIG. 8
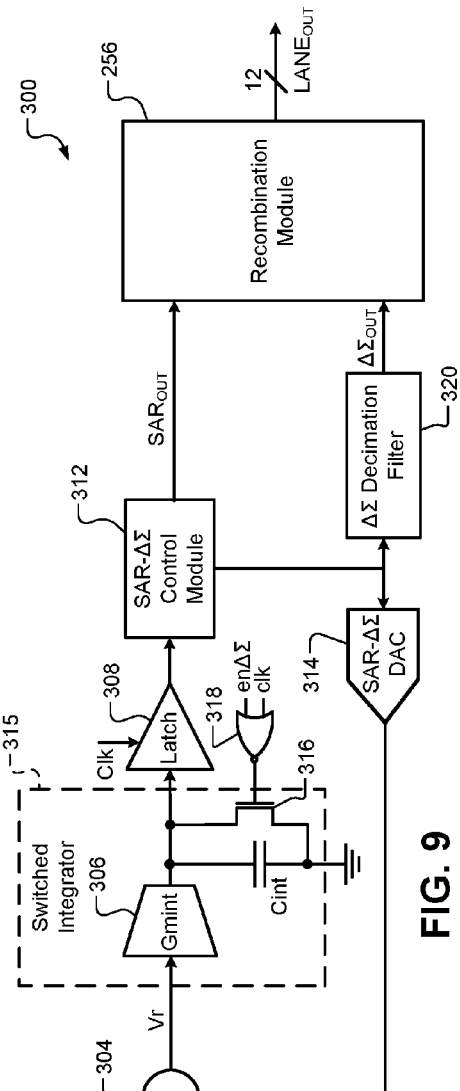
FIG. 9

ANALOG-TO-DIGITAL CONVERTERS FOR SUCCESSIVE APPROXIMATION INCORPORATING DELTA SIGMA ANALOG-TO-DIGITAL CONVERTERS AND HYBRID DIGITAL-TO-ANALOG WITH CHARGE-SHARING AND CHARGE REDISTRIBUTION

CROSS-REFERENCE TO RELATED APPLICATIONS

This application is a continuation of U.S. Non-Provisional application Ser. No. 15/210,051, filed Jul. 14, 2016, which is a continuation of U.S. Non-Provisional application Ser. No. 15/204,365, filed Jul. 7, 2016, which claims the benefit of U.S. Provisional Application No. 62/189,872, filed Jul. 8, 2015, U.S. Provisional Application No. 62/234,148, filed Sep. 29, 2015 and U.S. Provisional Application No. 62/200,823, filed Aug. 4, 2015. The entire disclosures of the applications referenced above are incorporated herein by reference.

FIELD

The present disclosure relates to topologies and methods for reducing the size and/or for reducing power demands of analog-to-digital converters.

BACKGROUND

A successive approximation register (SAR) analog-to-digital converter (ADC) converts an analog waveform into a discrete digital representation via a binary search through all possible quantization levels before finally converging upon a digital output for each conversion. A SAR ADC performs a successive approximation algorithm (or sometimes referred to as "a binary search algorithm") to provide a binary code. When the approximation is completed, the SAR ADC outputs an estimated digital output indicating the binary code.

SUMMARY

A hybrid digital-to-analog converter is provided including a first digital-to-analog converter and a second digital-to-analog converter. The first digital-to-analog converter is configured to (i) receive a digital input signal having an input voltage, and (ii) convert a first most-significant-bit of multiple bits of the digital input signal to be converted to an analog signal. The first digital-to-analog converter includes first capacitors. The first capacitors are charged by the input voltage and reference voltages during a sampling phase of the digital input signal. Charges of the first capacitors are shared during successive approximations of a first one or more bits of the digital input signal received by the hybrid digital-to-analog converter to provide the analog signal. The second digital-to-analog converter is configured to convert a first least-significant-bit of the bits of the digital input signal to be converted to the analog signal. The second digital-to-analog converter includes second capacitors. The second capacitors are charged based on a common mode voltage during the sampling phase of the digital input signal. The second digital-to-analog converter is to perform charge redistribution by connecting the second capacitors to receive the reference voltages during successive approximations of a second one or more bits of the digital input signal.

In other features, a method is provided and includes: receiving a digital input signal having an input voltage at a first digital-to-analog converter; converting a first most-significant-bit of multiple bits of the digital input signal to be converted to an analog signal via the a first digital-to-analog converter; and charging first capacitors of the a first digital-to-analog converter by the input voltage and reference voltages during a sampling phase of the digital input signal. The method further includes: sharing charges of the first capacitors during successive approximations of a first one or more bits of the digital input signal received by the hybrid digital-to-analog converter to provide the analog signal; converting a first least-significant-bit of the bits of the digital input signal to be converted to the analog signal at a second digital-to-analog converter; charging second capacitors of the second digital-to-analog converter based on a common mode voltage during the sampling phase of the digital input signal; and performing charge redistribution via the second digital-to-analog converter by connecting the second capacitors to receive the reference voltages during successive approximations of a second one or more bits of the digital signal.

In other features, an analog-to-digital converter is provided and includes a hybrid digital-to-analog converter, an amplifier, a latch and a successive approximation module. The hybrid digital-to-analog converter includes a first digital-to-analog converter and a second digital-to-analog converter. The first digital-to-analog converter is configured to (i) receive a digital input signal having an input voltage, and (ii) convert a first most-significant-bit of multiple bits of the digital input signal to be converted to an analog signal, where the first digital-to-analog converter comprises first capacitors. The first capacitors are charged by the input voltage and reference voltages during a sampling phase of the digital input signal. Charges of the first capacitors are shared during successive approximations of a first one or more bits of a digital signal received by the hybrid digital-to-analog converter to provide the analog signal. The second digital-to-analog converter is configured to convert a first least-significant-bit of the bits of the digital input signal to be converted to the analog signal. The second digital-to-analog converter includes second capacitors. The second capacitors are charged based on a common mode voltage during the sampling phase of the digital input signal. The second digital-to-analog converter is to perform charge redistribution by connecting the second capacitors to receive the reference voltages during successive approximations of a second one or more bits of the digital signal. The amplifier or integrator is configured to amplify or integrate the analog signal. The latch is configured to latch an output of the amplifier or integrator. The successive approximation module is configured to (i) receive an output of the latch, and (ii) perform the successive approximations of the first one or more bits of the digital signal and the successive approximations of the second one or more bits of the digital signal.

In other features, an analog-to-digital converter is provided and includes a first analog-to-digital converter, a second analog-to-digital converter and a combination module. The first analog-to-digital converter is configured to receive an analog input signal and convert the analog input signal to a first digital signal. The first analog-to-digital converter includes a successive approximation module. The successive approximation module is configured to perform a successive approximation to generate the first digital signal. The second analog-to-digital converter is configured to convert an analog output of the first analog-to-digital converter to a second digital signal. The analog output of the first analog-to-digital converter is generated based on the analog input signal. The second analog-to-digital converter is a fine conversion analog-to-digital converter relative to the first analog-to-digital converter. The second analog-to-digital converter comprises a decimation filter. The decimation filter is configured to: suppress noise which reduces amplification and power consumption requirements of the first digital-to-analog converter; and perform a delta-sigma decimation process to generate the second digital signal based on the analog output of the first analog-to-digital converter. The combination module is configured to combine the first digital signal and the second digital signal to provide a resultant output signal.

In other features, a method is provided and includes: receiving an analog input signal and converting the analog input signal to a first digital signal at a first analog-to-digital converter; performing a successive approximation to generate the first digital signal via the first analog-to-digital converter; and converting an analog output of the first analog-to-digital converter to a second digital signal via a second analog-to-digital converter, where the second analog-to-digital converter is a fine conversion analog-to-digital converter relative to the first analog-to-digital converter. The method further includes: suppressing noise via a decimation filter of the second analog-to-digital converter; performing a delta-sigma conversion via the second analog-to-digital converter to generate a second digital signal based on the analog output of the first analog-to-digital converter, where the analog output of the first digital-to-analog converter is generated based on the analog input signal; and combining the first digital signal and the second digital signal to provide a resultant output signal.

In other features, an analog-to-digital converter is provided and includes a digital-to-analog converter circuit, a sample and hold circuit, a subtractor, an amplifier, a latch and a successive approximation module. The digital-to-analog converter circuit is configured to convert multiple bits of a digital signal to an analog signal. The sample and hold circuit is configured to sample an analog input signal. The subtractor is configured to subtract the analog signal from an output of the sample and hold circuit. The digital-to-analog converter circuit includes: a first digital-to-analog converter configured to convert a first most-significant-bit of the bits; and a second digital-to-analog converter configured to convert a first least-significant-bit of the bits, where the second digital-to-analog converter is a delta-sigma digital-to-analog converter. The amplifier is configured to amplify an output of the digital-to-analog converter circuit. The latch is configured to latch an output of the amplifier. The successive approximation module is configured to (i) receive an output of the latch, and (ii) perform successive approximations to generate the digital signal.

In other features, an analog-to-digital converter is provided and includes a sample and hold circuit, a first analog-to-digital converter, a second analog-to-digital converter and a combination circuit. The sample and hold circuit is configured to sample an analog input signal to generate multiple bits. The first analog-to-digital converter is configured to generate a first digital signal based on the analog input signal. The first analog-to-digital converter includes a charge-sharing digital-to-analog converter and a charge redistribution digital-to-analog converter. The charge-sharing digital-to-analog converter is configured to convert a first most-significant-bit of the plurality of bits. The charge redistribution digital-to-analog converter is configured to convert a first least significant bit of the bits. The first digital signal is generated based on an output of the charge-sharing digital-to-analog converter and an output of the charge redistribution digital-to-analog converter. The second analog-to-digital converter is configured to generate a second digital signal based on an output of the first analog-to-digital converter. The second analog-to-digital converter includes a delta sigma digital-to-analog converter. The delta sigma digital-to-analog converter is configured to convert a second least significant bit of the bits. The second digital signal is generated based on an output of the delta sigma digital-to-analog converter. The second analog-to-digital converter is a fine conversion analog-to-digital converter relative to the first analog-to-digital converter. The combination circuit is configured to combine the first digital signal and the second digital signal to provide a resultant output signal.

In other features, a method is provided and includes: sampling an analog input signal to generate multiple bits; and generating a first digital signal based on the analog input signal via a first analog-to-digital converter. The generation of the first digital signal includes converting a first most-significant-bit of the bits via a charge-sharing digital-to-analog converter, and converting a first least significant bit of the bits via a charge redistribution digital-to-analog converter. The first digital signal is generated based on an output of the charge-sharing digital-to-analog converter and an output of the charge redistribution digital-to-analog converter. The method further includes generating a second digital signal based on an output of the first analog-to-digital converter via a second analog-to-digital converter including converting a second least significant bit of the bits via a delta sigma digital-to-analog converter. The second digital signal is generated based on an output of the delta sigma digital-to-analog converter. The second analog-to-digital converter is a fine conversion analog-to-digital converter relative to the first analog-to-digital converter. The method further includes combining the first digital signal and the second digital signal to provide a resultant output signal.

In other features, an analog-to-digital converter is provided and includes a digital-to-analog converter circuit, a sample and hold circuit, a subtractor, an amplifier, a latch and a successive approximation module. The digital-to-analog converter circuit is configured to convert bits of a digital signal to an analog signal. The sample and hold circuit is configured to sample an analog input signal. The subtractor is configured to subtract the analog signal from an output of the sample and hold circuit. The digital-to-analog converter circuit includes: a first digital-to-analog converter configured to convert a first most-significant-bit of the bits; a second digital-to-analog converter configured to convert a first least significant bit of the bits; and a third digital-to-analog converter configured to convert a second least-significant-bit of the bits. The amplifier is configured to at least one of amplify or integrate an output of the digital-to-analog converter circuit. The latch is configured to latch an output of the amplifier. The successive approximation module is configured to (i) receive an output of the latch, and (ii) perform successive approximations to generate the digital signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

FIG. 6 is an example plot of SAR residual voltage ranges in accordance with an embodiment of the present disclosure.

FIG. 7 is another example plot of SAR residual voltage ranges in accordance with an embodiment of the present disclosure.

FIG. 8 is an example signal plot for the SAR-ΔΣ ADC of FIG. 4.

FIG. 9 is a block schematic view of an example of a SAR-ΔΣ ADC incorporating a switched integrator and latch for both coarse and fine DAC conversions in accordance with an embodiment of the present disclosure.

In the drawings, reference numbers are reused to identify similar and/or identical elements.

DESCRIPTION

The below disclosed examples provide different implementations of SAR-DACs. These different implementations are referred to as "hybrid charge-sharing charge-redistribution SAR-DACs" or simply "hybrid SAR-DACs" and have corresponding disclosed circuits, systems and methods. The hybrid SAR-DACs are introduced to provide area efficient SAR-ADCs due to SAR-DAC architectures that minimize substrate surface area requirements of both a DAC core and a DAC reference voltage generator. Examples of hybrid SAR-DACs are shown in FIGS. 4, 6, 9, 11 and 12.

Figure 1:
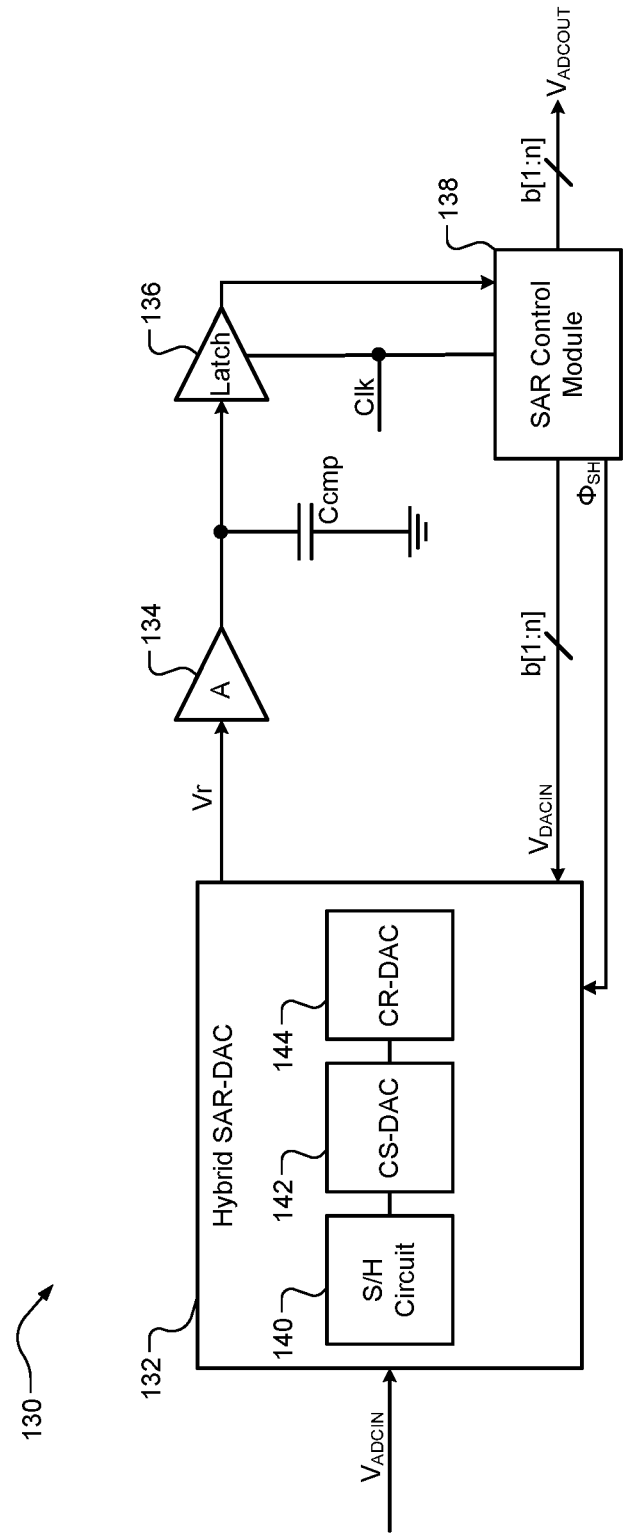
FIG. 1 is a block schematic view of an example SAR-ADC incorporating a hybrid SAR-DAC in accordance with an embodiment of the present disclosure.

FIG. 1 shows a SAR-ADC 130 that includes a hybrid SAR-DAC 132, an amplifier 134, a latch 136 and a SAR control module 138. A combination of the amplifier 134 and the latch 136 referred to as a comparator and, in an embodiment, compares an output of the hybrid SAR-DAC 132 with, for example, a reference voltage Vref. The amplifiers disclosed herein are referred to as pre-amplifiers as the amplifiers perform amplification prior to latching and successive approximation. The SAR control module 138 is part of a feedback loop that feeds back a digital signal $V_{DACIN}$. The hybrid SAR-DAC 132 receives an analog input voltage $V_{ADCIN}$, the digital signal $V_{DACIN}$, and a S/H phase signal $\Phi_{SH}$. The hybrid SAR-DAC 132 includes a sample and hold (S/H) circuit 140, a charge-sharing (CS) DAC (CS-DAC) 142, and a charge-redistribution (CR) DAC (CR-DAC) 144. The S/H circuit 140 receives and samples the analog input voltage $V_{ADCIN}$. The DACs 142, 144 perform digital-to-analog conversions, as further described below. Output of the S/H circuit 140 is provided to the CS-DAC 142. Output of the CS-DAC 142 is provided to the CR-DAC 144. Output of the CR-DAC 144 is provided to the amplifier 134.

The amplifier 134 provides an amplified output across a capacitor Ccmp. The latch 136 operates based on a clock signal Clk and latches an output of the amplifier 134, which is provided to the SAR control module 138. The SAR control module 138 performs a successive approximation algorithm (or sometimes referred to as "a binary search algorithm") based on the output of the latch 136 to provide a binary code, which is dependent on (i) a current bit being approximated and (ii) bits previously approximated. The SAR control module 138 provides (i) the S/H phase signal $\Phi_{SH}$ to the S/H circuit 140, and (ii) the digital signal $V_{DACIN}$ in the form of switch control signals b[1:n] to the DACs 142, 144 to control switches of bit circuits of the DACs 142, 144.

Figure 2:
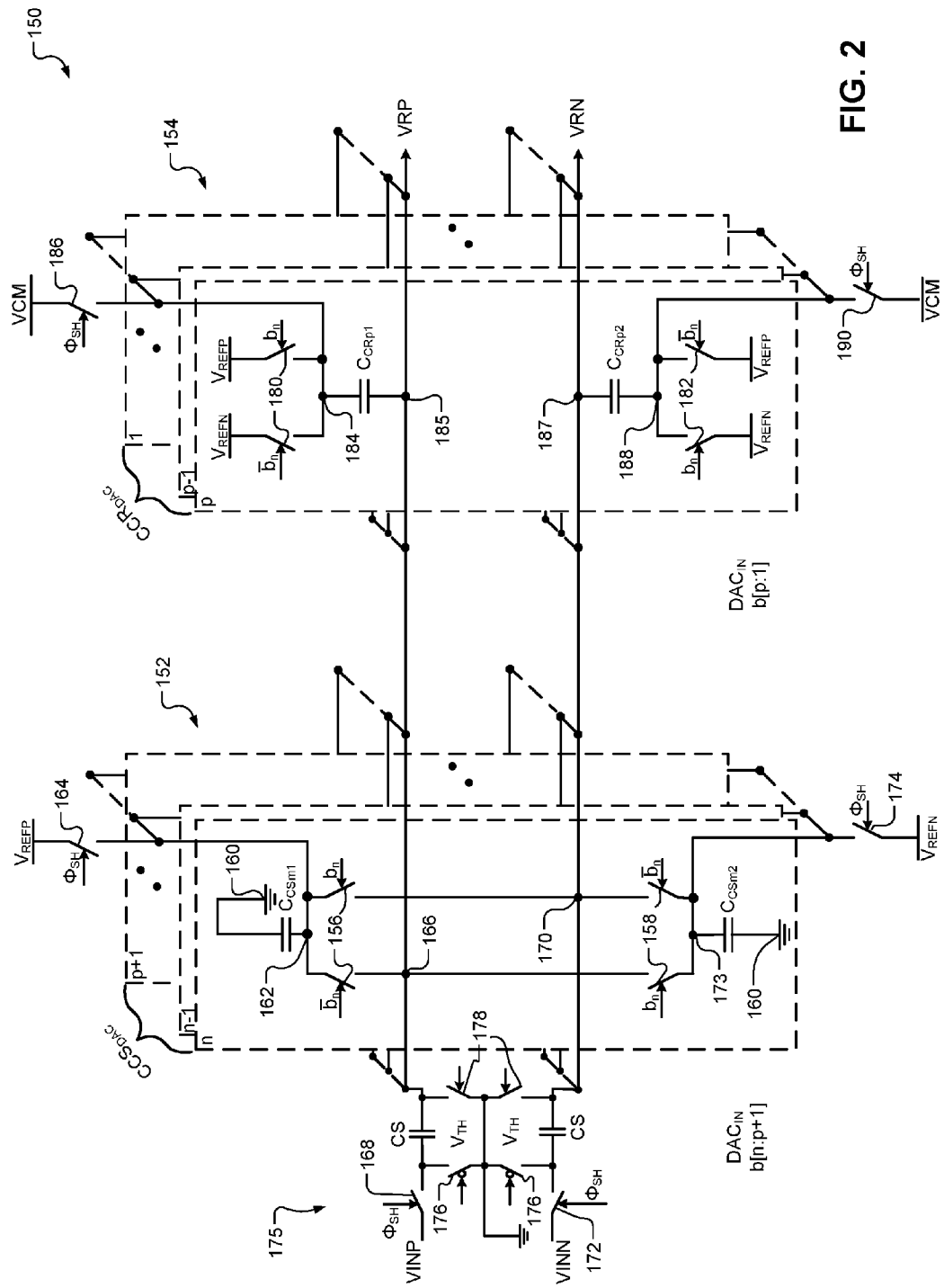
FIG. 2 is a schematic view of an example of the hybrid SAR-DAC of FIG. 1.

FIG. 2 shows a hybrid SAR-DAC 150, which is a n-bit fully differential SAR-DAC and in one embodiment replaces the hybrid SAR-DAC 132 of FIG. 1. The SAR-DAC 150 includes DACs 152, 154, which are binary-weighted. A binary weighted DAC refers to a DAC where capacitance weighting for each bit being converted is a product of (i) $2^{bit\#-1}$ and (ii) a capacitance weighting for a corresponding bit (e.g., a most significant bit for a charge sharing DAC or a least significant bit (LSB) for a charge redistribution DAC). For example, if a capacitance weighting for a LSB is 600 atto-Farad (aF), then a capacitance weighting for a second bit is $600 \cdot 2^{2-1} = 1200$ aF, a third bit is $600 \cdot 2^{3-1} = 2400$ aF, etc. . . . . Each of the DACs 152, 154 is binary-weighted as the value of the capacitor pair $C_{CSm1} = C_{CSm2}$ scales between the different bits (n . . . to p+1 for DAC 152 and p . . . to 1 for DAC 154) according to the law $C_{CSm1}(j) = C_{CSm2}(j) = C0\hat{}2(j)$ (or $C_{CSm1}(j) = C_{CSm2}(j) = C0 \cdot 2^j$), where j is the bit number ranging from 1 to n. The capacitors $C_{CSm1}$, $C_{CSm2}$ are shared based on control signals $b_n$, $\bar{b}_n$. The capacitors $C_{CRp1}$, $C_{CRp2}$ are connected to reference voltages based on control signals $b_n$, $\bar{b}_n$. The hybrid SAR-DAC 150 includes (i) a m-bit binary weighted charge-sharing (CS) DAC (CS-DAC) 152 that resolves a first m most-significant-bits (MSBs), and (ii) a p-bit binary weighted charge-redistribution (CR) DAC (CR-DAC) 154 that resolves last p LSBs, where n=m+p and m and p are integers. In one embodiment, the operation of the SAR-DAC 150 is applied to non-binary weighted DACs.

The CS-DAC 152 includes bit circuits p+1 to n, where n is the number of bits being converted. Each of the bit circuits p+1 to n includes a first capacitor $C_{CSm1}$, a first pair of switches 156, a second pair of switches 158, and a second capacitor $C_{CSm2}$. In one embodiment, the capacitors $C_{CSm1}$, $C_{CSm2}$ have the same capacitance and are connected to a ground reference 160. A first node 162 is connected to the first capacitor $C_{CSm1}$ and receives a reference voltage $V_{REFP}$ based on a state of a first switch 164. A second node 166 is connected between one of the switches 156 and one of the switches 158. The second node 166 receives an input voltage VINP based on a state of a first input switch 168, and provides an output voltage VRP. A third node 170 is connected between a second one of the switches 156 and a second one of the switches 158. The third node 170 receives an input voltage VINN based on a state of a second input switch 172 and provides an output voltage VRN. A fourth node 173 is connected to capacitor $C_{CSm2}$, and receives a reference voltage $V_{REFN}$ based on a state of a switch 174. In one embodiment, a difference between the input voltages VINP, VINN is the same as the input voltage $V_{ADCIN}$ of FIG. 1. Each of the switches 156, 158 receives a corresponding one of control signals $b_n$, $\bar{b}_n$. Each of the switches 164, 168, 172, 174 is controlled by a S/H phase signal $\Phi_{SH}$, which part of the sample and hold circuit 140 of FIG. 1. The switches 164, 174 receive reference voltages $V_{REFP}$, $V_{REFN}$. Two sampling capacitors CS are connected in series between nodes 166, 170. A common mode voltage VCM exists between the capacitors CS. In one embodiment, the common mode voltage VCM is predetermined and/or generated by a voltage generator and/or a control module (e.g., one of the control modules disclosed herein). Each of the bit circuits p+1 to n receives the input voltages VINP, VINN, performs a respective conversion based on corresponding ones of received control signals $b_n$, $\bar{b}_n$ from the SAR control module 138 of FIG. 1 and provides output voltages VRP, VRN.

A S/H circuit 175 includes the switches 168, 172 that receive the analog input voltages VINP, VINN. The analog input voltages VINP, VINN are provided to capacitors CS, which are connected to inputs of CS-DAC 152. A first pair of switches 176 is connected in series and between (i) a first terminal connected between the switch 168 and a first one of the capacitors CS, and (ii) a second terminal connected between the switch 172 and a second one of the capacitors CS. A second pair of switches 178 is connected in series and between (i) a first terminal connected between the first one of the capacitors CS and a first input of the CS-DAC 152, and (ii) a second terminal connected between the second one of the capacitors CS and a second input of the CS-DAC 152. Terminals between the first pair of switches 176 and between the second pair of switches 178 are connected to ground. The switches 168, 172, 178 receive S/H phase signal $\Phi_{SH}$. The switches 176 receive an inverted version of the S/H phase signal $\Phi_{SH}$.

The CR-DAC 154 is connected to the output of the CS-DAC 152 and includes bit circuits 1 to p. Each of the bit circuits 1 to p includes a first pair of switches 180, a first capacitor $C_{CRp1}$, a second capacitance $C_{CRp2}$, and a second pair of switches 182. The capacitors $C_{CRp1}$, $C_{CRp2}$ are the same capacitance, in an embodiment. The first pair of switches 180 are connected respectively between the voltage references $V_{REFN}$, $V_{REFP}$ and the first capacitor $C_{CRp1}$. The second pair of switches 182 are connected respectively between the voltage references $V_{REFN}$, $V_{REFP}$ and the second capacitor $C_{CRp2}$. Each of the switches 180, 182 in the bit circuits 1 to p receives a corresponding one of digital output bits (or control signals) $b_n$, $\bar{b}_n$ from the SAR control module 138 for the bit number associated with the bit circuit of the switches 180, 182.

A first node 184 between the switches 180 and the capacitor $C_{CRp1}$ receives the common mode voltage VCM based on a state of a first S/H switch 186. A second node 185 between the capacitor $C_{CRp1}$ and the CS-DAC 152 provides the positive output voltage VRP. A third node 187 between the capacitor $C_{CRp2}$ and a second output of the CS-DAC 152 provides the negative output voltage VRN. A fourth node 188 between the switches 182 and the second capacitor $C_{CRp2}$ receives the common mode voltage VCM based on a state of switch 190. The switches 186, 190 receive the S/H phase signal $\Phi_{SH}$. Each of the bit circuits 1 to p: receives the input voltages VINP, VINN; performs a respective conversion based on corresponding ones of the control signals $b_n$, $\bar{b}_n$; and provides outputs voltages VRP, VRN.

During a sampling phase, capacitor CS and $CCS_{DAC}$ of the CS-DAC 152 are pre-charged with input voltages VINP, VINN and reference voltages $V_{REFP}$, $V_{REFN}$ respectively while capacitor $CCR_{DAC}$ of the CR-DAC 154 is pre-charged at VCM. During the sampling phase, each of the switches 164, 168, 172, 174, 186, 190 are closed and switches 156, 158, 180, 182 are open. During a first m-cycles, states of the switches 156, 158, 180, 182 change based on the control signals $b_n$, $\bar{b}_n$ and the charges are shared (additively/subtractively) in successive approximations between the capacitors CS and $CCS_{DAC}$ to be minimized at the end of the m-cycle conversion. Each of the m-cycles is associated with a respective successive approximation. A residual output voltage after the m-cycles is then converted in successive approximation using the CR-DAC 154. An n-bit data output of the hybrid SAR-DAC 150 provided after a last cycle n as represented by equation 1, where $$\frac{CS}{CS + CCS_{DAC} + CCR_{DAC}}$$

is the transfer function from the reference voltage to the input of the comparator.

$$Vr(n) = \frac{CS}{CS + CCS_{DAC} + CCR_{DAC}} \left[ -V_{IN} + \left( \sum_{i=1}^{m} b_{i+p} \frac{CCS_i}{CS} \right) \cdot V_{REF} + \left( \sum_{i=1}^{p} b_i \frac{CCR_i}{CS} \right) \cdot V_{REF} \right], \quad (1)$$

where $\sum_{i=1}^{m} CCS_i = CCS_{DAC}$, $\sum_{i=1}^{p} CCR_i = CCR_{DAC}$, $b_i = \pm 1$ The hybrid SAR-DAC 150 uses charge-sharing capacitors for MSB transitions. Switch parasitics associated with the MSBs is a small portion of the capacitance of the hybrid SAR-DAC 150 and does not significantly impact linearity performance of the hybrid SAR-DAC 150. Reference capacitors, capacitors connected to reference voltage terminals, do not have constraints on noise/ripple during the MSBs transitions, where the noise/ripple on the reference capacitors is at a maximum. Consequently, selection restrictions of the reference capacitors is relaxed (or reduced) to reduce a required substrate surface area. Smaller reference capacitors are used due to the CS-DAC 152 converting MSBs. Since smaller capacitances are used, surface area needed for the reference capacitors is reduced. Reference capacitors (not shown in FIG. 2) are used to minimize the ripple on the reference voltages VREFP and VREFN due to the DAC activity (connecting and disconnecting the DAC capacitances $C_{CSm1}$, $C_{CSm2}$, $C_{CRp1}$, $C_{CRp2}$, etc. . . . in FIG. 2).

The hybrid SAR-DAC 150 uses charge-redistribution capacitors for LSB transitions. Noise/ripple of reference voltages during LSB transitions is small and has a transfer function corresponding to comparator input nodes with a large attenuation benefit due to the charge-sharing capacitors associated with the MSBs, as indicated in equation 1. Consequently, the noise/ripple during the LSB transitions does not significantly impact linearity/noise performance of the hybrid SAR-DAC 150. Capacitors associated with the LSBs are parasitic-insensitive (switch parasitic is on the reference sides of DAC capacitors) and the LSB capacitance is therefore scaled down to a technology node limit capacitance (e.g., $C_{min\_tech}$) or to a kT/C limit (e.g., $C_{min\_noise}$), which allows a DAC core area to be minimized. Alignment between the CS-DAC 152 and the CR-DAC 154 is accomplished through calibration of the capacitors $C_{CSm1}$, $C_{CSm2}$, $C_{CRp1}$, $C_{CRp2}$. This calibration is performed to adjust and/or measure the values of the capacitors $C_{CSm1}$, $C_{CSm2}$, $C_{CRp1}$, $C_{CRp2}$ due to differences between preselected capacitances and actual capacitances.

Referring again to FIG. 1, the SAR control module 138 includes a SAR and control logic devices for generating, for example bit control signals $b_n$, $\bar{b}_n$, S/H phase signal $\Phi_{SH}$, etc. The SAR control module 138 performs a successive approximation algorithm to generate the bit control signals $b_n$, $\bar{b}_n$ based on a clock signal Clk and an output of the latch 136. For further defined structure of the SAR control module 138 of FIG. 1 see below provided methods and below provided definition for the term "module". In one embodiment, the circuits disclosed herein are operated using example methods illustrated in FIGS. 2, 7 and 14.

Figure 3:
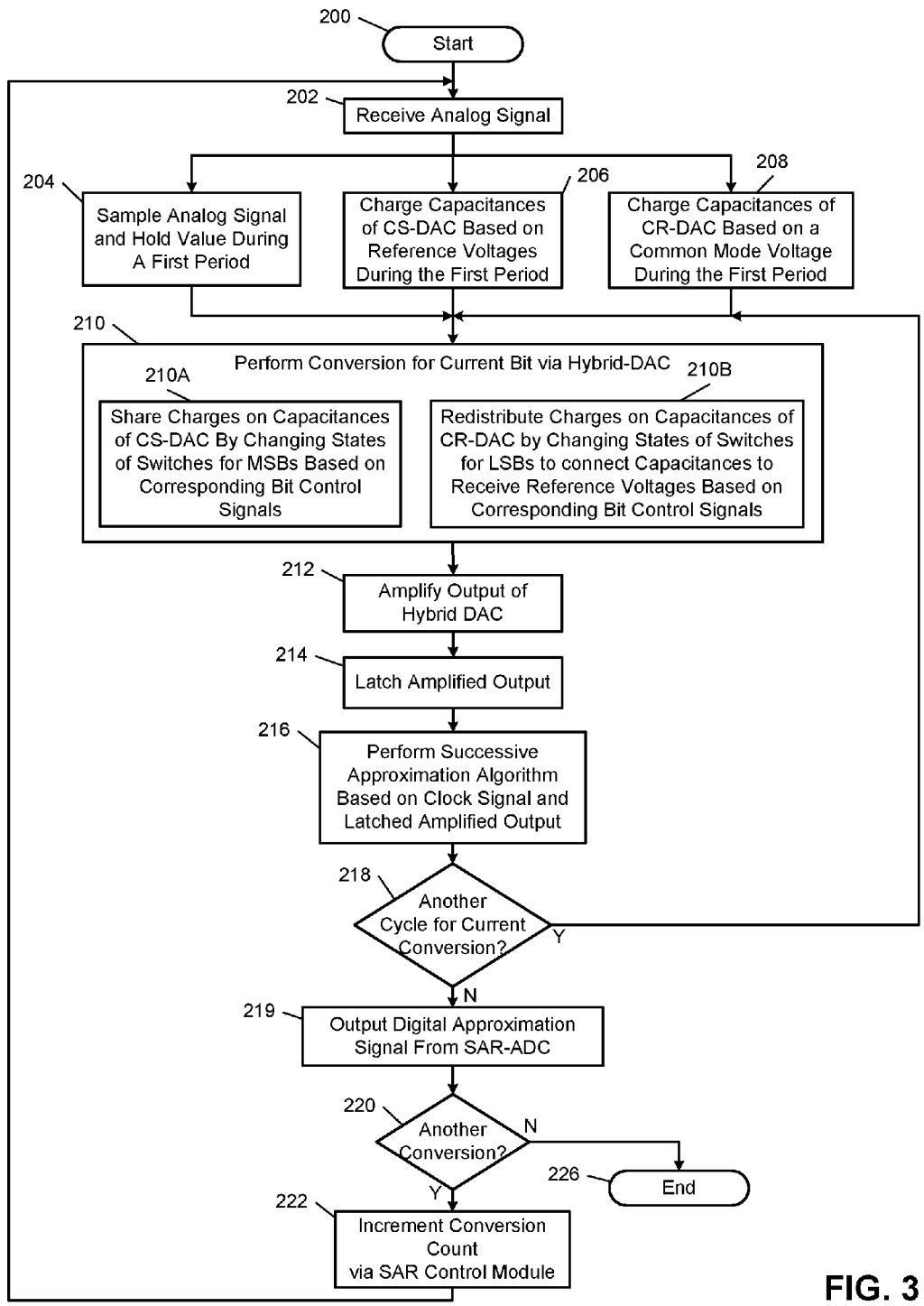
FIG. 3 illustrates an example of an analog-to-digital conversion method including a digital-to-analog conversion method which in accordance with an embodiment of the present disclosure is implemented by the SAR-ADC of FIG. 1.

FIG. 3 shows an example of an analog-to-digital conversion method including a digital-to-analog conversion method. Although the following operations are primarily described with respect to the implementations of FIGS. 1-2, the operations are readily modified to apply to other implementations of the present disclosure. The operations are iteratively performed. In an embodiment, and begin at 200. At 202, the S/H circuit 140 receives the analog signal VINP, VINN. The following operations 204, 206 and 208 are performed during the same (first) period of time. At 204, the S/H circuit 140 including switches 168, 172 samples and holds a voltage of the analog signal VINP, VINN. At 206, capacitors $C_{CSm1}$, $C_{CSm2}$ of the CS-DAC 152 are charged based on reference voltages $V_{REFP}$, $V_{REFN}$. At 208, capacitors $C_{CRp1}$, $C_{CRp2}$ of the CR-DAC 154 are charged based on the common mode voltage VCM.

At 210, the hybrid DAC 150 performs a conversion for current bit during a second period of time. If a MSB of a predetermined number of MSBs is being converted, then the SAR control module 138 at 210A generates the bit control signals b[1:n] such that charges on the capacitors $C_{CSm1}$, $C_{CSm2}$ of CS-DAC 152 are shared by changing states of switches 156, 158. If a LSB of a predetermined number of LSBs is being converted, then the SAR control module 138 at 210B generates the bit control signals b[1:n] such that charges on the capacitors $C_{CRp1}$, $C_{CRp2}$ are redistributed by changing states of the switches 180, 182 to connect the capacitors $C_{CRp1}$, $C_{CRp2}$ to received reference voltages $V_{REFN}$, $V_{REFP}$.

At 212, output of the hybrid SAR-DAC 132 is provided to the amplifier 134. The output is residual voltage Vr (or positive and negative output residual voltages VRP, VRN of the nodes 166, 170). At 214, the latch 136 latches the residual voltage Vr based on the clock signal Clk. At 216, the SAR control module 138 performs a successive approximation algorithm based on the clock signal Clk and latched amplified output of the latch 136. The successive approximation algorithm includes, for example, converting an analog signal into a discrete digital representation via a binary search of all possible quantization levels before finally converging upon a digital output for each conversion.

At 218, the SAR control module 138 determines whether another cycle for current conversion is to be performed. If another conversion is to be performed, task 210 is performed, otherwise task 219 is performed. At 219, the SAR control module 138 outputs a digital signal representing a word converted by the SAR-ADC 130.

At 220, the SAR control module 138 determines whether another conversion is to be performed. If another conversion is to be performed, task 222 is performed, otherwise the method ends at 226. At 222, a conversion count is incremented by the SAR control module 138. The method ends at 226.

The above-described operations are meant to be illustrative examples; in one or more embodiments, the operations are performed sequentially, synchronously, simultaneously, continuously, during overlapping time periods or in a different order depending upon the application. Also, in one or more embodiments, one or more of the operations is not performed or skipped depending on the implementation and/or sequence of events.

In addition, to providing area efficient SAR-ADCs with reduced size as compared to traditional SAR-ADCs, power efficient ADCs that consume less power than traditional ADCs are also disclosed herein. The disclosed ADCs include successive approximation delta sigma ($\Delta\Sigma$) ADCs. The $\Delta\Sigma$ ADCs are applicable to the hybrid SAR-DACs or used in other applications separate and/or independent of the hybrid SAR-DACs. The $\Delta\Sigma$ ADCs are applicable to any type of ADC, where thermal noise is a significant contributor to an effective number of bits (ENOBs) being converted.

In one embodiment, a combined low power and substrate surface area efficient ADC is used on a mixed signal system-on-chip (SOC). In scaled technologies, power challenges have been addressed using SAR architectures often in combination with techniques such as redundancy and asynchronous operation and time interleaving to meet application sampling rate requirements. However, for high-resolution ADCs (e.g., greater than or equal to 10 effective number of bits (ENOB)), a traditional SAR-ADC is intrinsically energy inefficient since the SAR-ADC reuses a same low noise comparator to perform both (i) coarse conversions where little accuracy is required, and (ii) fine conversions where thermal noise is of importance. The energy inefficiency associated with a traditional SAR-ADC is addressed by the example hybrid SAR-$\Delta\Sigma$ ADCs disclosed below with respect to FIGS. 4-6.

Substrate surface area associated with a SAR-ADC has been reduced in recent years with the introduction of digital DAC linearity calibration schemes that relax matching requirements allowing SAR-DAC capacitors to be scaled down to kT/C limits. In high-resolution noise-limited DAC, DAC capacitance grows 4× for every extra bit of resolution while, at the same time, a size of voltage noise/ripple on a reference voltage needs to be reduced 2× to preserve linearity. This sets difficult to meet requirements for a reference generator of a high-resolution charge-redistribution SAR-ADC, especially if no external components are used. This requires large on chip capacitors. Traditionally this issue has been addressed using (i) traditional DAC switching schemes that optimize current absorbed, or (ii) traditional DAC topologies that are more immune to reference voltage ripple (e.g., current steering or capacitive charge sharing).

Figure 4:
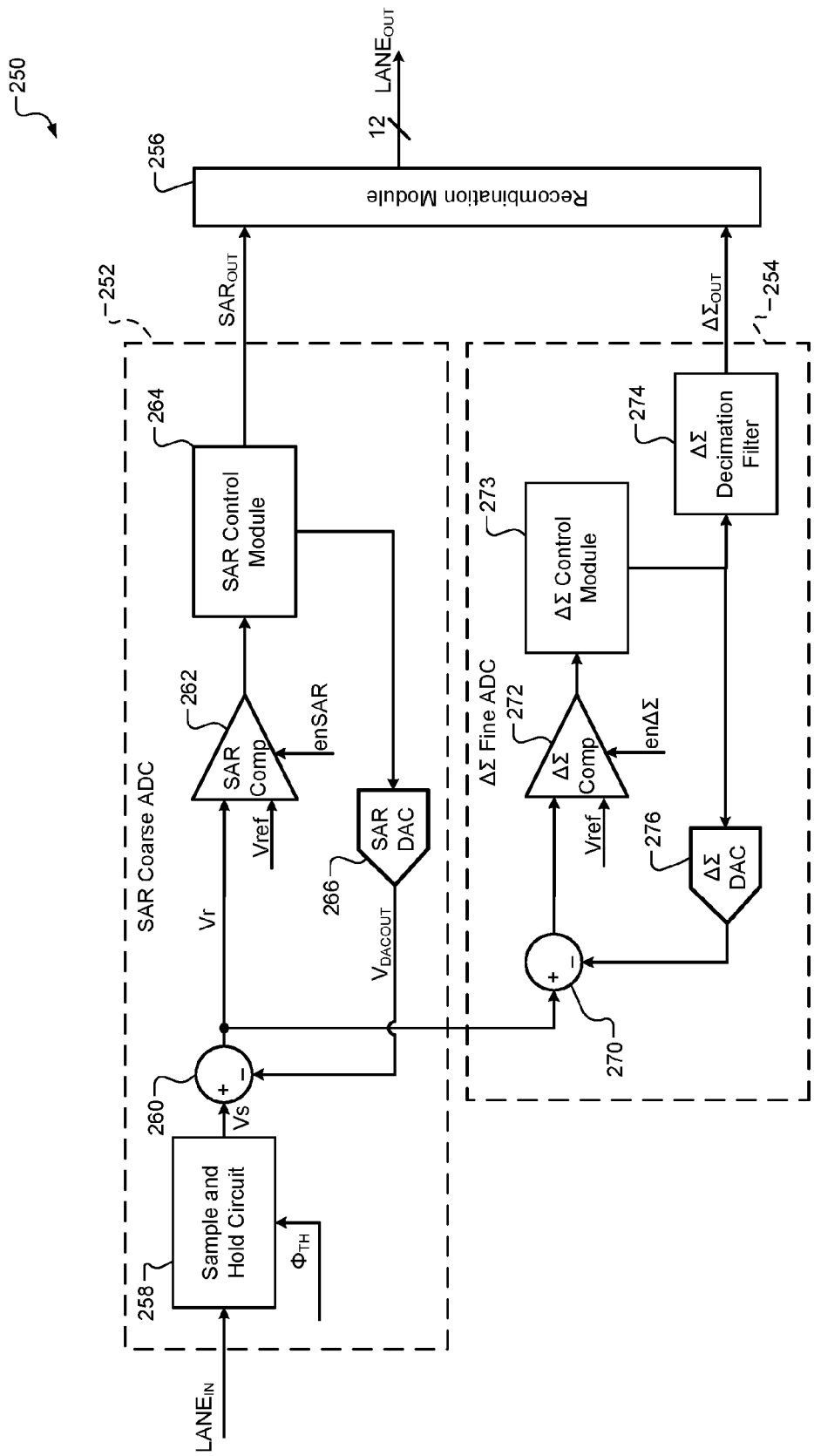
FIG. 4 is a block schematic view of an example of a SAR-ΔΣ ADC incorporating coarse and fine DACs in accordance with an embodiment of the present disclosure.

FIG. 4 shows an example ADC 250. The ADC 250 includes a SAR coarse ADC 252, a $\Delta\Sigma$ fine ADC 254 and a recombination module 256. The SAR coarse ADC 252 includes a S/H circuit 258, a subtractor 260, a SAR comparator 262, a SAR control module 264, and a SAR-DAC 266. The $\Delta\Sigma$ fine ADC 254 includes a subtractor 270, a $\Delta\Sigma$ comparator 272, a $\Delta\Sigma$ control module 273, a $\Delta\Sigma$ decimation filter 274, and a $\Delta\Sigma$ DAC 276. The S/H circuit 258 receives an analog input voltage $LANE_{IN}$, samples the analog input voltage $LANE_{IN}$, and holds the sampled voltage based on a S/H phase signal $\Phi_{SH}$. The term "lane" as used herein refers to a signal path, bit circuit, and/or a conductor. In one embodiment, a lane has a single input and a single output or a differential input and a differential output. The subtractor 260 subtracts output of the SAR-DAC 266 from an output of the S/H circuit 258.

The SAR comparator 262 compares an output of the subtractor 260 with a reference voltage Vref based on an enable signal enSAR. The SAR control module 264 performs a successive approximation algorithm and provides a digital output to the SAR-DAC 266. After a last cycle of an analog-to-digital conversion, the SAR control module 264 provides a digital output $SAR_{OUT}$ to the recombination module 256. In one embodiment, the S/H circuit 258, subtractor 260 and SAR-DAC 266 are replaced by one of the hybrid SAR-DACs 132, 150 of FIGS. 1 and 2. The SAR-DAC 266 or one of the hybrid SAR-DACs 132, 150 performs a digital-to-analog conversion for a predetermined number of bits (e.g., 10 bits with 9 bit resolution). In one embodiment, if one of the hybrid SAR-DACs 132, 150 is used, 4 MSBs and 6 LSBs are converted, where one of the CS-DACs 142, 152 converts the 4 MSBs and one of the CR-DACs 144, 154 converts the 6 LSBs.

Figure 11:
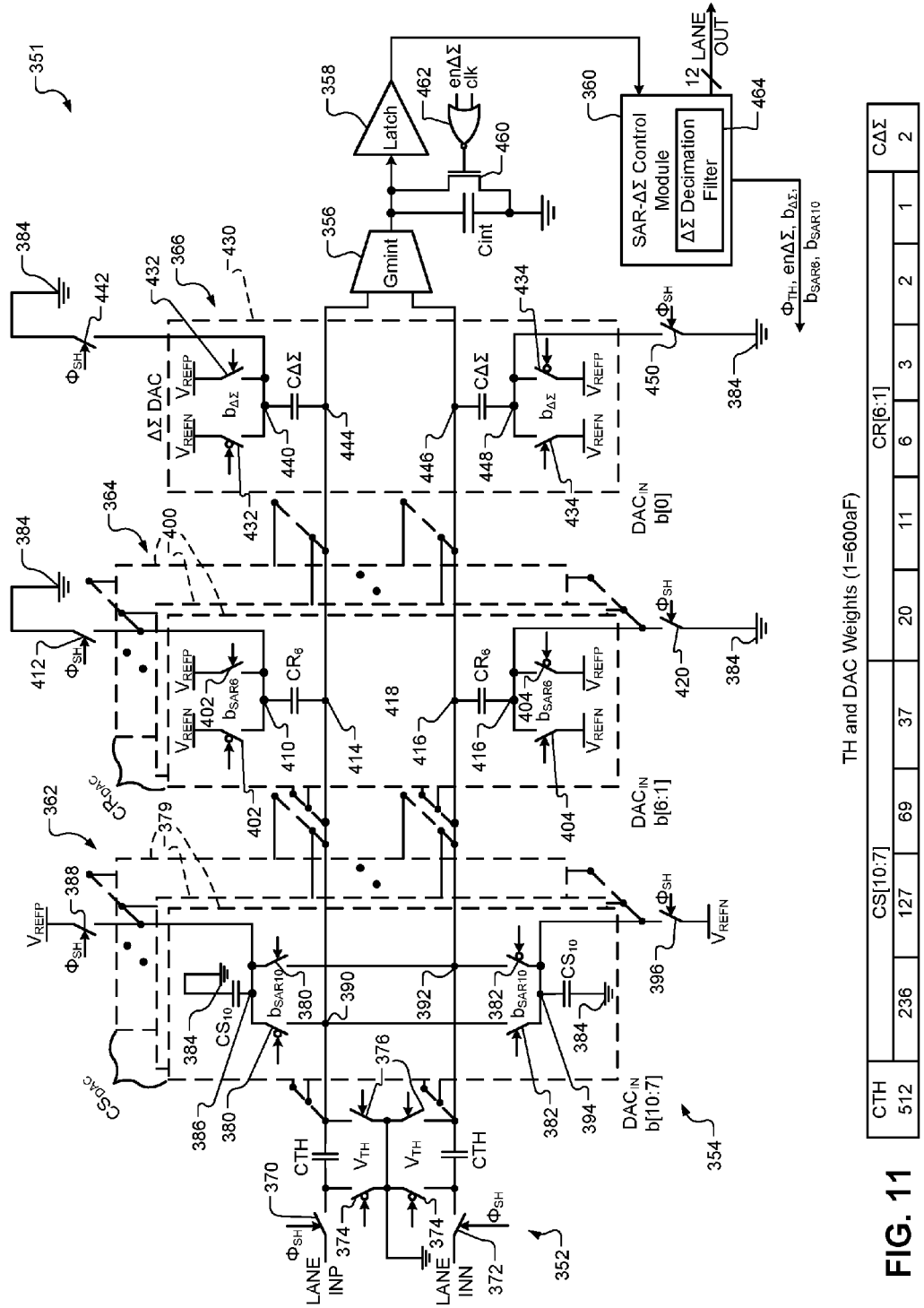
FIG. 11 is a block schematic view of another example of a hybrid DAC including a charge-sharing (CS) charge-redistribution (CR) segmented DAC and a ΔΣ DAC in accordance with an embodiment of the present disclosure.

The subtractor 270 subtracts a residual output voltage Vr of the SAR subtractor 260 from an output of the ΔΣ-DAC 276. The ΔΣ comparator 272 compares an output of the subtractor 270 with the reference voltage Vref based on an enable signal enΔΣ. The ΔΣ control module 273 performs a ΔΣ algorithm and provides a digital output to the ΔΣ-DAC 276 and the ΔΣ decimation filter 274. In one embodiment, the ΔΣ algorithm includes (i) providing an output of the comparator 272 directly to the ΔΣ DAC 276 and directly to the ΔΣ decimation filter 274, and (ii) tracking a number of cycles performed by the ΔΣ fine ADC 254 to provide a status of a conversion being performed. The ΔΣ decimation filter 274 filters an output of the ΔΣ control module 273 and provides a digital output to the recombination module 256. After a last cycle of an analog-to-digital conversion, the ΔΣ decimation filter 274 provides the digital output $\Delta\Sigma_{OUT}$ to the recombination module 256. In one embodiment, the ΔΣ-DAC 276 is configured as shown in FIG. 11 and performs a digital-to-analog conversion for one or more LSBs. As an example, the one or more LSBs include a first LSB. The next 6 LSBs are converted by the SAR-DAC 266 or one of the hybrid SAR-DACs 132, 150. The recombination module 256 combines the outputs $SAR_{OUT}$ and $\Delta\Sigma_{OUT}$ to provide a digital output $LANE_{OUT}$ (12-bit output with a 11-bit resolution).

During operation, the ΔΣ fine ADC 254 converts the SAR residual error ($V_S - V_{DAC}$) at an end of the conversion performed by the SAR coarse ADC 252. The SAR coarse ADC 252 periodically and/or iteratively performs multiple conversion cycles for each conversion performed by the ΔΣ fine ADC 254. In one embodiment, the SAR control module 264 performs multiple successive approximations until settling on a final successive approximation for one or more bits prior to the ΔΣ fine ADC 254 performing a conversion based on a difference between the result of the final successive approximation and an output of the ΔΣ DAC 276. The filtered output $\Delta\Sigma_{OUT}$ of the ΔΣ fine ADC 254 is combined with the output $SAR_{OUT}$ of the SAR conversion performed by the SAR coarse ADC 252 to provide a final output $LANE_{OUT}$. During a SAR phase, the received signal $LANE_{IN}$ is sampled and the SAR coarse ADC 252 performs a first N conversions, where enSAR=1 and enSD=0 for N clock periods. Subsequent to the SAR phase, a ΔΣ phase is performed, the error ($V_S - V_{DAC}$) at the end of the SAR phase is fed into the ΔΣ fine ADC 254 and is converted for M clock periods, where enSAR=0 and enSD=1 for the M clock periods.

Figure 5:
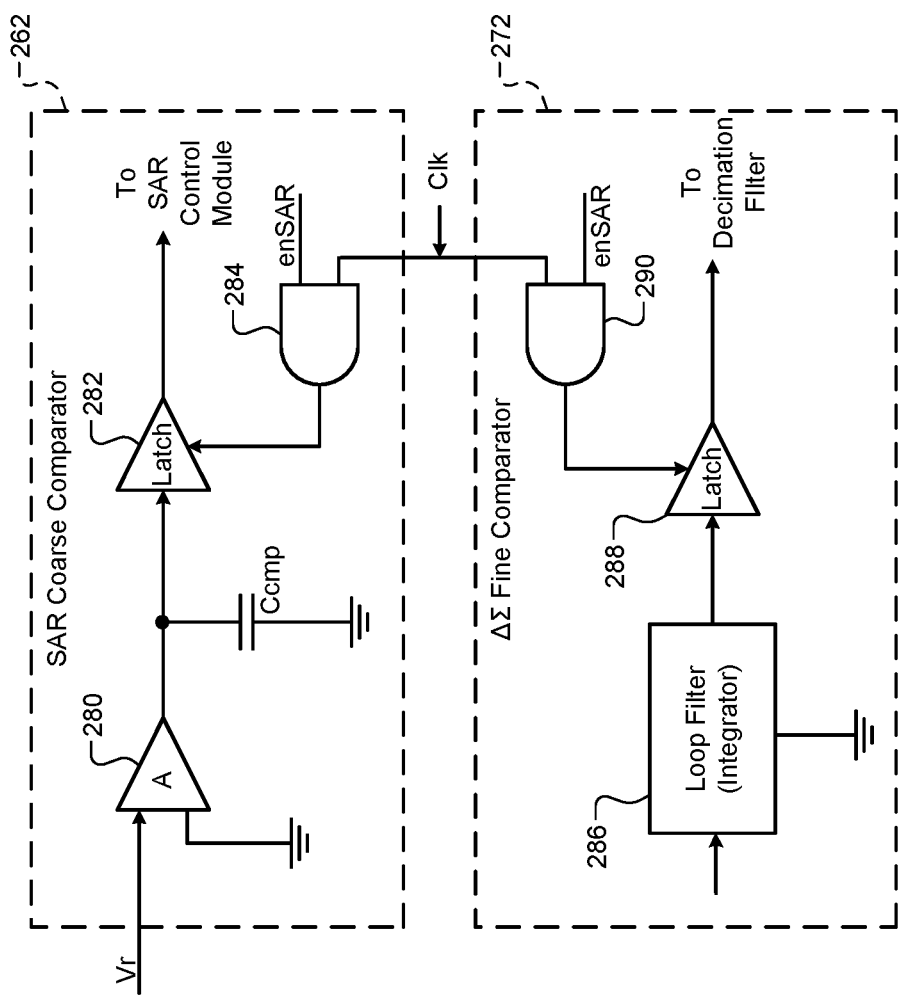
FIG. 5 is a block schematic view of examples of a SAR comparator and a ΔΣ comparator of the SAR-ΔΣ ADC of FIG. 4.

FIG. 5 shows examples of the SAR comparator 262 and ΔΣ comparator 272. The SAR comparator 262 includes an amplifier 280, a first latch 282 and a first AND gate 284. The amplifier 280 (i) receives the residual voltage Vr from the subtractor 260 of FIG. 4, and (ii) compares the residual voltage Vr to a reference voltage or ground reference, as shown. The amplifier 280 receives the voltage Vr and a reference voltage from, for example, a reference terminal or ground, as shown. The amplifier 280 compares the voltage Vr to the reference voltage. An output of the amplifier 280 is connected to a capacitor Ccmp, which is connected to a ground reference. The latch 282 latches (or holds) a voltage seen across the capacitor Ccmp based on an output of the first AND gate 284 and provides the voltage as an output. The first AND gate 284 receives the enable signal enSAR and clock signal Clk. The SAR control module 264 of FIG. 4 generates the enable signal enSAR, as described above with respect to FIG. 4.

The ΔΣ comparator 272 includes a loop filter 286, a second latch 288 and a second AND gate 290. The loop filter 286 includes and/or be implemented as an integrator and receives an output of the subtractor 270 (shown in FIG. 4). The loop filter 286 filters and/or integrates the output of the subtractor 270. The integration includes summing outputs of the subtractor 270. An output of the loop filter 286 is provided to the second latch 288, which is controlled by the second AND gate 290. The second AND gate 290 receives the enable signal enΔΣ and the clock signal Clk.

Referring again to FIG. 4, the SAR coarse ADC 252 is a non-binary 10-bit SAR-ADC (with 9 bit equivalent resolution). The ΔΣ fine ADC 254 is implemented as a single-bit first-order continuous-time incremental ΔΣ ADC (with a 2× over range). The SAR coarse ADC 252 and ΔΣ fine ADC 254 as shown provide improved resolution over traditional SAR-ADCs due to use of both a SAR coarse ADC and a ΔΣ fine ADC having a 2× over range. This is shown in FIG. 6, where the ΔΣ fine ADC input range (or input range of the ΔΣ fine ADC 254) is twice the SAR quantization range (or output range of the SAR coarse ADC 252). FIG. 6 shows an example plot of SAR residual voltage ranges for a ΔΣ fine ADC input, SAR quantization plus SAR loop noise, and SAR quantization alone. The SAR residual voltage $V_{SAR\ Residual}$ (or Vr) is equal to $V_S - V_{DAC}$.

FIG. 7 shows an example plot of SAR voltage residual ranges for another example implementation, where the ΔΣ fine ADC input range (or full scale voltage $V_{FSSD}$ of the ΔΣ fine ADC 254) is greater than 3 times SAR loop noise $\sigma_{loop}$. By setting the full scale voltage $V_{FSSD}$ greater than 3 times SAR loop noise $\sigma_{loop}$, noise and power requirements permitted to be reduced.

FIG. 8 shows an example signal plot illustrating cycle timing of the SAR-ΔΣ ADCs. A clock signal Clk, a S/H phase signal $\Phi_{SH}$, a SAR (or first) enable signal enSAR, and a ΔΣ (or second) enable signal are shown. As shown, an analog input signal is sampled during an OFF period $T_{TH}$ of the clock signal Clk. Then the clock signal Clk is ON and the first enable signal enSAR is transitioned HIGH to enable the SAR comparator 262 and perform MSB conversions during a second period $T_{SAR}$. As an example, this occurs for 10 clock cycles. Following the second period, the first enable signal enSAR is transitioned LOW and the second enable signal enΔΣ is transitioned HIGH to enable the ΔΣ comparator 272. The ΔΣ comparator 272 is HIGH for a third period $T_{\Delta\Sigma}$ (e.g., 8 clock cycles) to perform LSB conversions. The overall time to perform an analog-to-digital conversion, which includes a sum of the periods $T_{TH}$, $T_{SAR}$, $T_{\Delta\Sigma}$ is referred to as lane period $T_{LANE}$.

After sampling of analog signal and a coarse SAR-ADC conversion phase (e.g., 10 clock cycles) of the SAR coarse ADC 252, a SAR residual error is converted by the fine ΔΣ fine ADC 254 during a fine ADC conversion phase (e.g., 8 clock cycles). The decisions (e.g., 8 decisions) performed by the comparator of the ΔΣ fine ADC 254 are summed with different weights before being recombined with the SAR$_{OUT}$ to provide a final code (e.g., the 12-bit signal LANE$_{OUT}$). In one embodiment, the operation of the ΔΣ fine ADC 254 is equivalent to applying an 8-tap low pass finite impulse response (FIR) filter and then performing a decimation by 8.

Once SAR$_{OUT}$ and ΔΣ$_{OUT}$ are combined, the residual error includes, in addition to sampling kT/C noise, only ΔΣ fine ADC 204 noise components (i.e. ΔΣ quantization noise, latch thermal-noise, and loop filter thermal-noise). All these components are low-pass filtered by the ΔΣ decimation filter 274 (shown in FIG. 4), which in one embodiment operates as a low pass FIR filter having an equivalent bandwidth approximately equal to 1/TΔΣ, where TΔΣ is a conversion time of the ΔΣ fine ADC 254. Since both quantization and latch thermal-noise are 1$^{st}$ order shaped, the quantization and latch thermal-noise are strongly suppressed by the FIR leaving as dominant terms the sampling kT/C noise and the input referred noise of the integrator of the ΔΣ fine ADC 254 with an integration time TAX. Since the integrator is inside a ΔΣ loop, a gain calibration is not needed and improved linearity performance is provided.

Reduced Hardware Implementation

In one embodiment, the ΔΣ fine ADC 254 is embedded in and/or merged with the SAR coarse ADC 252 and a single comparator latch is reused to minimize hardware overhead. FIG. 9 shows a SAR-ADC 300 that includes a S/H circuit 302, a subtractor 304, a comparator static amplifier (or gain integrator (Gmint)) 306, a latch 308, a SAR-ΔΣ control module 312, and a SAR-ΔΣ DAC 314. The SAR-ADC 300 is a reduced hardware example of the SAR-ΔΣ ADC of FIG. 4 with reduced number of hardware components and thus reduced overall size. If a switched integrator (e.g., switched integrator 315) is used as a SAR amplifier (e.g., replaces the amplifier 280 of FIG. 5), then the switched integrator is reused as a first order loop filter of a ΔΣ-ADC, as provided by a combination of the gain integrator 306 and the switch 316. In one embodiment, the switch integrator 315 includes and/or functions as a combination of the gain integrator, a load capacitor Cint and/or the switch 316. When the switched integrator is reused, the load capacitor Ccmp is not reset via switch 316. In one embodiment, the SAR comparator (e.g., combination of amplifier 280 and latch 282 or combination of gain integrator 306 and latch 308) is reused for, as an example, a single bit implementation, where a single bit is converted during each clock cycle.

The S/H circuit 302 receives an analog input voltage LANE$_{IN}$, samples the analog input voltage LANE$_{IN}$, and holds the sampled voltage based on a S/H phase signal Φ$_{SH}$. The subtractor 304 subtracts an output of the SAR-ΔΣ DAC 314 from an output of the S/H circuit 302. The gain integrator 306 receives an output voltage V$_{SARRES}$ from the subtractor 304 performs integration to provide an output across the load capacitor Cint. A transistor 316 is connected across the load capacitor Cint and receives a control input from an output of a NOR-gate 318. The NOR-gate 318 receives an enable signal enΔΣ and a clock signal Clk, such that the switch is On when both the enable signal enΔΣ and the clock signal Clk are low. The latch 308 latches, based on the clock signal Clk, a voltage across the load capacitor Cint and the transistor 316. The SAR-ΔΣ control module 312 performs a ΔΣ algorithm and provides signal SAR$_{OUT}$ to the recombination module 256. Digital output of the SAR-ΔΣ control module 312 is provided to the SAR-ΔΣ DAC 314 and a ΔΣ decimation filter 320. At the end of a conversion, the ΔΣ decimation filter 320 provides a digital output signal to the recombination module 256, which provides the signal LANE$_{OUT}$ (e.g., 12-bits representing analog input voltage provided by signal LANE$_{IN}$). The latch 308, switch integrator 315, NOR gate 318 operate as a combined coarse/fine ADC. The SAR-ΔΣ DAC 314 replaces and operates similar as the SAR DAC 266 and ΔΣ DAC of FIG. 4.

Reconfiguring a comparator static amplifier Gmint into a ΔΣ integrator includes stopping reset of the load capacitor Cint after a last SAR cycle (an example of which is shown in FIG. 11). In one embodiment, timing signals used for the ΔΣ conversion are generated using a self-timed loop technique including, for example a delay lock loop to generate timing signals, such as the S/H phase signal Φ$_{SH}$, the clock signal Clk, and/or one or more enable signals (e.g., one of the enable signals enΔΣ, enSAR shown in FIGS. 4 and 9).

A SAR-ADC that includes a CS-DAC (e.g., one of the CS-DACs 142, 152 of FIGS. 1-2) reduces substrate surface area (and power) requirements of a reference generator. A CS-DAC is highly insensitive to noise/ripple on voltage references since the voltage references (e.g., voltage references V$_{REFN}$, V$_{REFP}$ of FIG. 2) are physically disconnected via switches (e.g., switches 164, 174 of FIG. 2) from the CS-DAC during a successive approximations phase, as described above. This allows for a reduction in capacitances corresponding to voltage references. The CS-DAC, however, requires a top plate switch (switches are on a comparator end of the CS-DAC 152, such as switches 156, 158 of FIG. 2) and thus is parasitic capacitance sensitive. Scaling of LSB capacitances is therefore dictated by the parasitic capacitance of a minimum size top plate switch instead of kT/C noise requirements. For deep-submicron technology systems, this results in a higher DAC core area with respect to a CR-DAC. Use of a CS-DAC in combination with a CR-DAC allows for the DAC core area to not be increased since as described above the switch parasitics associated with MSBs is a small portion of the capacitance of the hybrid SAR-DAC. A large portion of the capacitance of the hybrid SAR-DAC is associated with the CS-DAC. Capacitances associated with the LSBs, which are handled by the CR-DAC, are small. Thus, the overall capacitance of the SAR-DAC is minimized, thereby reducing DAC core area and/or corresponding substrate area.

Loop Noise Comparison

A conventional SAR ADC experiences loop noise generated by a switched integrator (efficient amplifier implementation) with a settling time equal to T$_{clk}$/20, where the SAR loop noise is represented by equation 2, g$_{M,A}$ is the transconductance of the switched integrator, T$_{settl}$ is settling time, T$_{clk}$ is, k is Boltzman constant, T is sampling time.

$$\sigma_{loop,SAR} = \sqrt{\frac{2kT}{g_{M,A}T_{settl}}} = \sqrt{\frac{40kT}{g_{M,A}T_{clk}}} \quad (2)$$

In one embodiment, the ADC architectures of FIGS. 4, 5 and/or 9 having a first order single bit g$_{m,lpf}$-C type integrator circuit that experiences loop noise σ$_{SD}$ represented by equation 3, where: $g_{M,lpf}$ is gain associated with the integrator and low pass filter (provided by the capacitor C) of the integrator circuit;

$$\frac{\pi^2 V_{FSSD}^2}{9M^3}$$

is SD quantization noise, and $$\frac{2KT}{g_{M,lpf} MT_{clk}}$$

is loop filter thermal noise.

$$\sigma_{SD} = \sqrt{\frac{\pi^2 V_{FSSD}^2}{9M^3} + \frac{2KT}{g_{M,lpf} MT_{clk}}} \quad (3)$$

By choosing VFSSD=$3\sigma_{loop,SAR}$ and $g_{M,lpf}=g_{M,A}$, the SAR loop noise $\sigma_{SD}$ is represented by equation 4.

$$\sigma_{SD} \cong \sigma_{loop,SAR} \sqrt{\frac{\pi^2}{M^3} + \frac{1}{20M}} \quad (4)$$

If M=4, the SAR amplifier noise is suppressed by approximately 8 decibels (dB) with a 1.5 bit increase in ENOB with 4 additional clock cycles.

Energy Efficiency

A traditional SAR ADC, using a same amplifier for each SAR conversion cycle, having MSB decisions done with full noise performance, and implementing an integrator with a limited settling time $T_{sett1}$ (e.g., $T_{clk}/20$), in one embodiment, has a required amount of amplifier power represented by equation 5.

$$P_{SAR} \propto \frac{2KT}{\sigma_{loop}^2} N_{SAR} \quad (5)$$

The SAR amplifier noise for $N_b$ SAR conversion cycles of the ADC architectures of FIGS. 4-5 and/or 9 is suppressed during the ΔΣ phase. The SAR amplifier (e.g., the amplifier 280 of FIG. 5) is noisier and requires less power than the amplifier of the traditional SAR ADC. Loop filter noise is filtered by the ΔΣ decimation filter, where bandwidth (BW)=$1/MT_{clk}$. In one embodiment, the power provided to the SAR amplifiers of the disclosed ADC architectures is represented by equation 6.

$$P_{SAR-SD} \propto \frac{2KT}{\sigma_{loop}^2} \left( \frac{\pi^2}{M^3} + \frac{1}{20M} \right) (N_b + 20M) \to \frac{2KT}{\sigma_{loop}^2} \quad (6)$$

for highM

There is a 3 times power reduction for a same ENOB, where M=8, from the traditional SAR ADC and the disclosed ADC (or SAR-ΔΣ arrangement). For the same amount of noise and an example embodiment, the energy drawn by the disclosed SAR-ΔΣ arrangement is equal to the energy used by the traditional SAR ADC for a single SAR conversion cycle.

Energy efficiency is improved by incorporating a coarse ADC and a Delta-Sigma (ΔΣ) ADC as a fine ADC in a SAR-ADC as above-described. Energy efficiency is also improved while substrate surface area requirements are significantly reduced by using a segmented charge-sharing charge-redistribution DAC, such as that described above with respect to FIGS. 1-2.

Referring again to FIG. 5, noise associated with the latches 282, 288 (referred to as latch noise Vn) exists and/or is effectively provided (i) between the amplifier 280 and the latch 282, and (ii) between the loop filter 286 and the latch 288. The latch noise Vn is added to a signal provided to the latch 282 divided by dynamic gain of the amplifier 280. The latch noise Vn is added after the loop filter 286 and is suppressed by the feedback loop provided by the ΔΣ-DAC 276 of FIG. 4.

Figure 10:
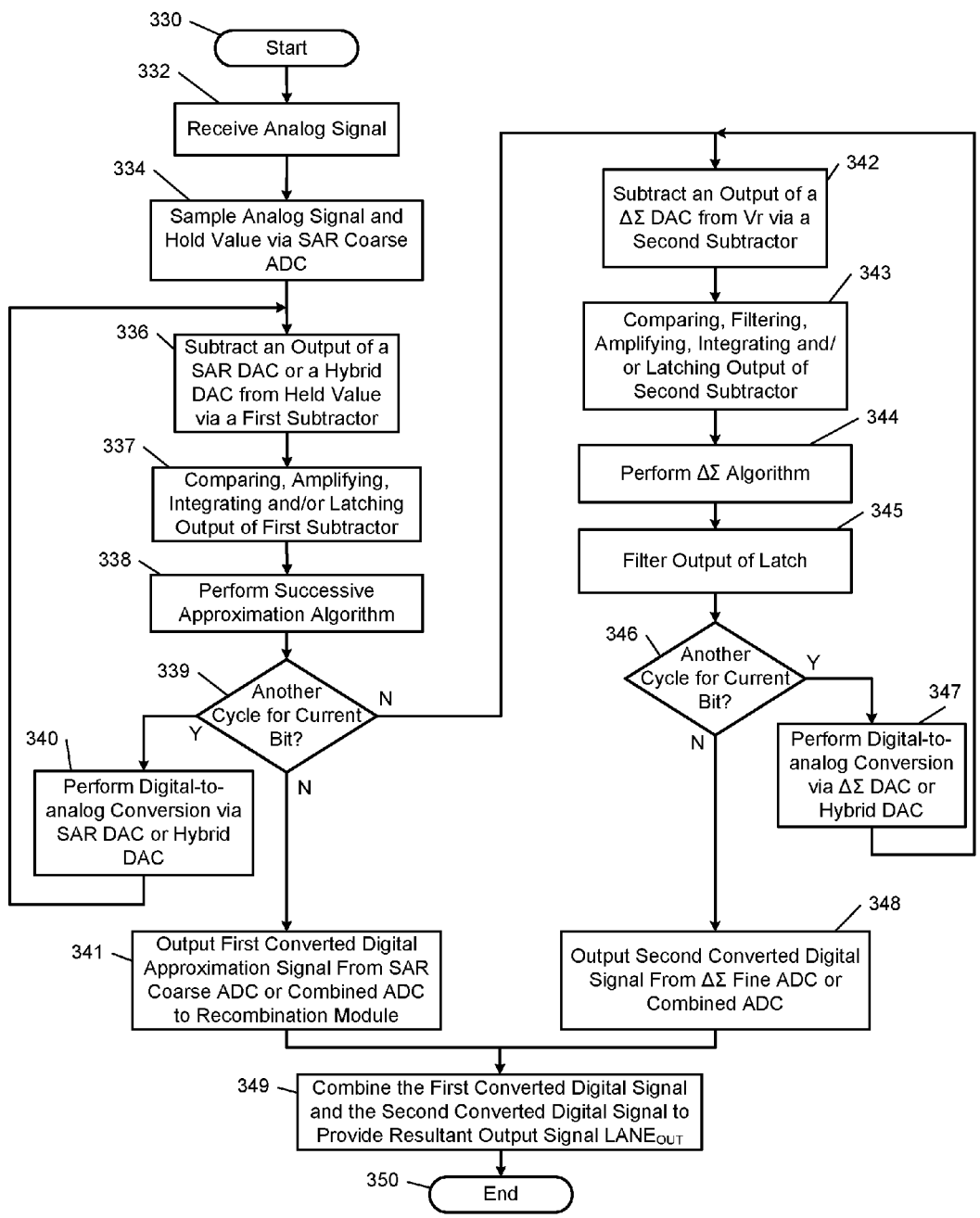
FIG. 10 illustrates another analog-to-digital conversion method in accordance with an embodiment of the present disclosure is implemented by the SAR-ΔΣ ADC of FIG. 9.

FIG. 10 shows an analog-to-digital conversion method. Although the following operations are primarily described with respect to the implementations of FIGS. 4-5 and 9, the operations are easily modified to apply to other implementations of the present disclosure. The operations are iteratively performed in an embodiment.

The method begins at 330. At 332, an analog signal $LANE_{IN}$ is received. At 334, a S/H circuit (e.g., one of the S/H circuits 258, 302) receives the analog signal $LANE_{IN}$.

The following operations 336-341 are performed by the SAR coarse ADC 252 or the ADC 300. At 336, the subtractor 260, 304 subtracts an output of the DAC 266, 314 from a held value provided by the S/H circuit. At 337, the output Vr of the subtractor 260, 304 is compared with a reference voltage, integrated, amplified and/or latched, as described above.

At 338, the control module 264, 312 executes a successive approximation algorithm based on the output of the latch 282, 308 to generate a digital approximation signal. At 339, the control module 264, 312 determines whether another cycle is to be performed for a current bit. If another cycle is to be performed, task 340 is performed, otherwise operations 341 and 342 are performed. At 340, the DAC 266, 314 performs a digital-to-analog conversion to generate an analog signal based on the digital approximation signal. Task 336 is performed subsequent to task 340. At 341, the last generated digital approximation signal is output from the control module 264, 312 to the recombination module 256.

The following operations 342-346 are performed by the ΔΣ fine ADC 254 or the hybrid ADC 300. At 342, the subtractor 270 subtracts an output of the ΔΣ-DAC 276 from Vr or the subtractor 304 subtracts the output of the SAR-ΔΣ DAC 314 from the held value of the S/H circuit 302. At 343, the output of the subtractor 270, 304 is compared with a reference voltage, integrated, amplified and/or latched, as described above.

At 344, the ΔΣ control module 273, 312 executes a ΔΣ algorithm based on the output of the latch 288, 308 to generate a second digital approximation signal. At 345, the ΔΣ decimation filter 274, 320 filters the output of the ΔΣ control module 273, 312 to generate a digital approximation signal. At 346 the control module 264, 312 determines whether another cycle is to be performed for a current bit. If another cycle is to be performed, task 347 s performed, otherwise operation 348 is performed. At 347 the ΔΣ-DAC 276 or SAR-ΔΣ DAC 314 (hybrid DAC) performs a digitalto-analog conversion of the digital approximation signal generated at 345. Task 343 is performed subsequent to task 347.

At 348 the last generated digital approximation signal generated by the $\Delta\Sigma$ fine ADC 254 or the hybrid ADC 300 is output from the $\Delta\Sigma$ decimation filter 274 or the control module 312 to the recombination module 256. At 349, the recombination module 256 combines the first converted digital signal and the second converted digital signals received at 341 and 348 to generate a resultant output signal LANE$_{OUT}$. As an example, the method ends at 350.

The above-described operations are meant to be illustrative examples; in one or more embodiments, the operations are performed sequentially, synchronously, simultaneously, continuously, during overlapping time periods or in a different order depending upon the application. Also, in one embodiment, one or more of the operations are not performed or skipped depending on the implementation and/or sequence of events.

To exploit the reduced surface area advantage of a CS-DAC in selection of voltage references while maintaining and/or minimizing the DAC core area, a segmented SAR-DAC architecture is disclosed. A detailed example of this architecture is shown in FIG. 11. FIG. 11 shows a SAR-ADC 351 that includes a S/H circuit 352, a hybrid DAC 354, a comparator static pre-amplifier 356, a latch 358, and a SAR-$\Delta\Sigma$ control module 360. The hybrid DAC 354 includes a CS-DAC 362, a CR-DAC 364 and a $\Delta\Sigma$-DAC 366. Each bit circuit of the $\Delta\Sigma$-DAC 366 is configured similarly to each bit circuit of the CR-DAC 364, but with different capacitance weighting, as is further described below.

The S/H circuit 352 includes switches 370, 372 that receive analog input voltages LANE INP, LANE INN. The analog input voltages LANE INP, LANE INN are provided to capacitors CTH, which are connected to inputs of CS-DAC 362. A first pair of switches 374 is connected in series and between (i) a first terminal connected between the switch 370 and a first one of the capacitors CTH, and (ii) a second terminal connected between the switch 372 and a second one of the capacitors CTH. A second pair of switches 376 is connected in series and between (i) a first terminal connected between the first one of the capacitors CTH and a first input of the CS-DAC 362, and (ii) a second terminal connected between the second one of the capacitors CTH and a second input of the CS-DAC 362. Terminals between the first pair of switches 374 and between the second pair of switches 376 are connected to ground. The switches 370, 372, 376 receive S/H phase signal $\Phi_{SH}$. The switches 374 receive an inverted version of the S/H phase signal $\Phi_{SH}$.

The CS-DAC 362 includes bit circuits 379 (e.g., bit circuits for bits b[n:p+1] or b[10:7] as shown in FIG. 2) and is configured similar to the CS-DAC 152 of FIG. 2. Each of the bit circuits 379 includes capacitors CS$_{10}$, a first pair of switches 380, and a second pair of switches 382. In one embodiment, the capacitors CS$_{10}$ have the same capacitance and are connected to a ground reference 384. A first node 386 is connected to one of the capacitors CS$_{10}$, and receives a reference voltage V$_{REFP}$ based on a state of a switch 388. A second node 390 is connected between one of the switches 380 and one of the switches 382. The second node 390 receives an input voltage from one of the capacitors CTH and provides an output voltage to the CR-DAC 364. A third node 392 is connected between a second one of the switches 380 and a second one of the switches 382. The third node 392 receives an input voltage from a second one of the capacitors CTH and provides an output voltage to the CR-DAC 364. A second one of the switches 380 and a first one of the switches 382 receives control signals b$_{SAR10}$. A first one of the switches 380 and a second one of the switches 382 receives inverted control signal $\overline{b}_{SAR10}$ represented by inverter signals on certain ones of the switches 380, 382. A fourth node 394 is connected to one of the capacitors CS$_{10}$, and receives a reference voltage V$_{REFN}$ based on a state of a switch 396. The switches 388, 396 are respectively controlled by a S/H phase signal $\Phi_{SH}$. The switches 388, 396 receive reference voltages V$_{REFP}$, V$_{REFN}$. Bit circuits 379 respectively receive voltages output from the S/H circuit 352 and perform a respective conversion based on corresponding ones of received control signals b$_{SAR10}$, $\overline{b}_{SAR10}$ from the SAR-$\Delta\Sigma$ control module 360; and provides output voltages to the comparator static pre-amplifier 356.

The CR-DAC 364 is connected to the output of the CS-DAC 362 and includes bit circuits 400 and is configured similar to the CR-DAC 154 of FIG. 2. Each of the bit circuits 400 includes a first pair of switches 402, capacitors CR$_6$, and a second pair of switches 404. In one embodiment, the capacitors CR$_6$ have the same capacitance. The first pair of switches 402 is connected respectively between the voltage references V$_{REFN}$, V$_{REFP}$ and one of the capacitors CR$_6$. The second pair of switches 404 is connected respectively between the voltage references V$_{REFN}$, V$_{REFP}$ and a second of the capacitors CR$_6$. Each of the switches 402, 404 receives a corresponding one of control signals b$_{SAR6}$, $\overline{b}_{SAR6}$ from the SAR-AE control module 360. As an example, the bit circuits 400 receive respective control signals for converting bits [6:1].

A first node 410 between the switches 402 and a first terminal of the first one of the capacitors CR$_6$ is connected to the ground reference 384 based on a state of a switch 412. A second node 414 connected to a second terminal of the first one of the capacitors CR$_6$ provides a first output voltage to the $\Delta\Sigma$-DAC 366. A third node 416 connected to a first terminal of the second one of the capacitors CR$_6$ provides a second output voltage to the $\Delta\Sigma$-DAC 366. A fourth node 418 between the switches 404 and a second terminal of the second one of the capacitors CR$_6$ is connected to the ground reference 384 based on a state of switch 420. The switches 412, 420 receive the S/H phase signal $\Phi_{SH}$. Each of the bit circuits 400: receives input voltages from the CS-DAC 362; performs a respective conversion based on corresponding ones of the control signals b$_{SAR6}$, $\overline{b}_{SAR6}$; and provides output voltages to the comparator static pre-amplifier 356.

The input referred thermal noise is reduced by the architecture of the $\Delta\Sigma$-DAC 366, as described above with the $\Delta\Sigma$ ADC 254 of FIG. 4. The $\Delta\Sigma$-DAC 366 includes one or more bit circuits (a single bit circuit 430 is shown). The bit circuit 430 is connected to the output of the CR-DAC 364 and includes a first pair of switches 432, capacitors CR$_{\Delta\Sigma}$, and a second pair of switches 434. In one embodiment, the capacitors CR$_{\Delta\Sigma}$ have the same capacitance. The first pair of switches 432 is connected respectively between the voltage references V$_{REFN}$, V$_{REFP}$ and one of the capacitors CR$_{\Delta\Sigma}$. The second pair of switches 434 is connected respectively between the voltage references V$_{REFN}$, V$_{REFP}$ and a second of the capacitors CR$_4$Y. Each of the switches 432, 434 receives a corresponding one of control signals b$_{\Delta\Sigma}$, $\overline{b}_{\Delta\Sigma}$ from the SAR-$\Delta\Sigma$ control module 360. As an example, the bit circuit 430 receives a control signal for converting bit [1:0].

A first node 440 between the switches 432 and a first terminal of the first one of the capacitors CR$_{\Delta\Sigma}$ is connected to the ground reference 384 based on a state of a switch 442. A second node 444 connected to a second terminal of the first one of the capacitors CR$_{\Delta\Sigma}$ provides a first output voltage to the ΔΣ-DAC 366. A third node 446 connected to a first terminal of the second one of the capacitors $CR_{\Delta\Sigma}$ provides a second output voltage to the ΔΣ-DAC 366. A fourth node 448 between the switches 434 and a second terminal of the second one of the capacitors $CR_{\Delta\Sigma}$ is connected to the ground reference 384 based on a state of switch 450. The switches 442, 450 receive the S/H phase signal $\Phi_{SH}$. The bit circuit 430: receives input voltages from the CR-DAC 364; performs a respective conversion based on corresponding ones of the control signals $b_{\Delta\Sigma}$, $\overline{b}_{\Delta\Sigma}$; and provides output voltages to the comparator static pre-amplifier 356.

The comparator static pre-amplifier 356 receives output voltages from the DACs 362, 364, 366 and performs integration to provide an output across a load capacitor Cint, as described above with respect to the integrator 306 of FIG. 9. In one embodiment, the integration includes summing a difference between the output voltages from the DACs 362, 364, 366 for a predetermined period of time. A transistor 460 is connected across the load capacitor Cint and receives a control input from an output of a NOR-gate 462. The NOR-gate 462 receives an enable signal enΔΣ and a clock signal Clk. The latch 358 latches, based on the clock signal Clk, a voltage across the load capacitor Cint and the transistor 460. Although the SAR-ΔΣ control module 360 is shown as including a ΔΣ decimation filter 464, in another embodiment the ΔΣ decimation filter 464 is separate from the SAR-ΔΣ control module 360, as similarly shown in FIG. 9. The SAR-ΔΣ control module 360 provides: S/H phase signal $\Phi_{SH}$ to the S/H circuit 352 and the DACs 362, 364, 366; a digital output and signals $\Phi_{SH}$, $\overline{b}_{SAR10}$, $b_{SAR6}$, $\overline{b}_{SAR6}$, $b_{\Delta\Sigma}$, $\overline{b}_{\Delta\Sigma}$ to the DACs 362, 364, 366; and signals enΔΣ, Clk to the NOR gate 462. At the end of a conversion, the SAR-ΔΣ control module 360 provides a digital output as $LANE_{OUT}$ (e.g., 12-bits representing analog input voltage provided by input voltage signals LANE INP, LANE INN).

The segmented architecture of the hybrid DAC 354 includes the CS-DAC 362 for a predetermined number of MSBs (e.g., 4-MSBs), the CR-DAC 364 for LSBs (e.g., 6-LSBs) and/or the ΔΣ-DAC 366 for one or more LSBs. In one embodiment, the ΔΣ-DAC 366 is not included. Switch parasitic capacitances in the CS-DAC 362 are a small portion of the DAC capacitances of the hybrid DAC 354 and do not significantly impact linearity performance. In one embodiment, the capacitances of the CR-DAC 364 are scaled down as in a conventional CR-DAC. The voltage reference noise/ripple for the LSBs is reduced by $2^4$ (or 2 to the power 4 or the number of MSBs). The voltage reference noise/ripple is also attenuated at an input of the corresponding comparator due to the inclusion of the capacitors CS, which are connected to the ground reference 384. As a result and as an example, for a SAR-DAC core capacitance of 300 femtoFarad (fF), capacitance of the corresponding reference lane is only 5 picoFarad (pF).

FIG. 11 further includes a table including TH and DAC weights, which refer to respective capacitances of the S/H circuit 352 and DACs 362, 364, 366. Each of the weights multiplied by, a predetermined capacitance (e.g., 600 attofarad (aF)) provides the capacitance of the corresponding capacitance. Multiple weights are provided for the DACs 362, 364 respectively and correspond to bits converted by the DACs 362, 364. For example, bit 7 of the CS-DAC 362 has the weight 37, which if multiplied by the predetermined capacitance provides the value of each of the capacitors $CS_{10}$ for that bit.

Figure 12:
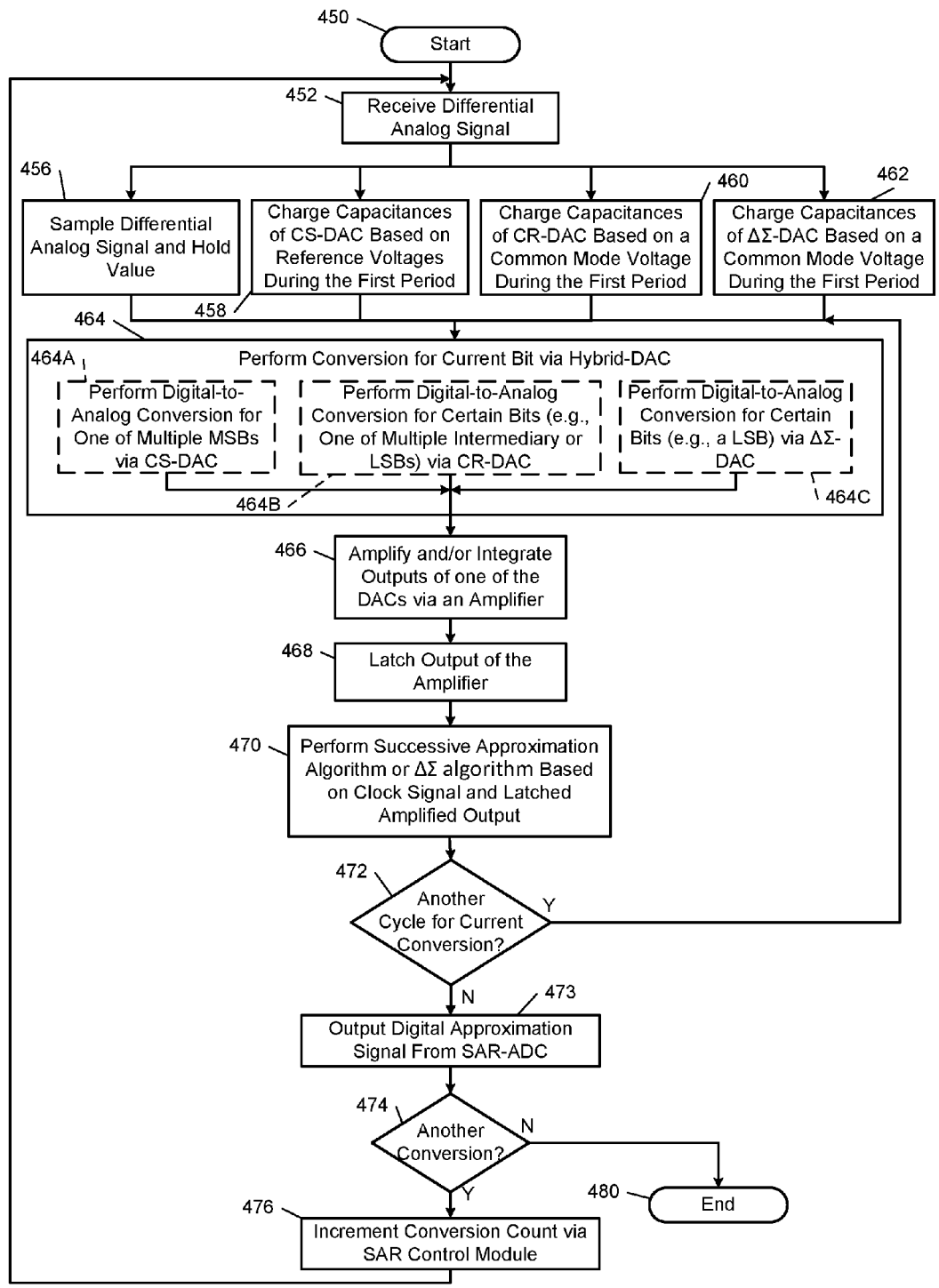
FIG. 12 illustrates an example of another analog-to-digital conversion method in accordance with an embodiment of the present disclosure is implemented by the hybrid DAC of FIG. 11.

FIG. 12 shows an example of an analog-to-digital conversion method including a digital-to-analog conversion method. Although the following operations are primarily described with respect to the implementations of FIGS. 9 and 11, the operations are easily modified to apply to other implementations of the present disclosure. In one embodiment, the operations are iteratively performed. The method begins at 450. At 452, the S/H circuit 302 receives the analog signal LANEINP, LANEINN, which is the input differential analog signal having positive and negative potentials, as shown in FIG. 11.

In one embodiment, the following operations 456, 458, 460, 462 are performed during the same (first) period of time. At 456, the S/H circuit 302 including switches 370, 372 samples and holds a voltage of the analog signal LANEINP, LANEINN. At 458, capacitors $CS_{10}$ of the CS-DAC 362 are charged based on reference voltages $V_{REFP}$, $V_{REFN}$. At 460, capacitors $CR_6$ of the CR-DAC 364 are charged based on the common mode voltage VCM. At 462, capacitors CΔΣ of the ΔΣ-DAC 366 are charged based on the common mode voltage VCM.

At 464, the hybrid DAC 314 or 354 performs a conversion for current bits during a second period of time. If a MSB of a predetermined number of MSBs is being converted, then the SAR-ΔΣ control module 360 at 464A generates the bit control signals b[1:n] such that charges on the capacitors $CS_{10}$ of CS-DAC 362 are shared by changing states of switches 380, 382. If intermediary bits or one or more LSBs are being converted, then the SAR-ΔΣ control module 312, 360 at 464B generates the bit control signals b[1:n] such that charges on the capacitors $CR_6$ are redistributed by changing states of the switches 402, 404 to connect the capacitors $CR_6$ to received reference voltages $V_{REFN}$, $V_{REFP}$. If a LSB of a predetermined number of LSBs is being converted, then the SAR-ΔΣ control module 360 at 464C generates the bit control signals b[1:n] such that charges on the capacitors CΔΣ are redistributed by changing states of the switches 432, 434 to connect the capacitors CΔΣ to received reference voltages $V_{REFN}$, $V_{REFP}$.

At 466, output of the hybrid DAC 314, 354 is provided to the amplifier 306, 356. The output is residual voltage Vr (or VRP, VRN). At 468, the latch 308, 358 latches the residual voltage Vr based on the clock signal Clk. At 470, the SAR-ΔΣ control module 312, 360 performs a successive approximation algorithm or ΔΣ algorithm based on the clock signal Clk and latched amplified output of the latch 308, 358. The successive approximation algorithm includes, for example, converting an analog signal into a discrete digital representation via a binary search of all possible quantization levels before finally converging upon a digital output for each conversion.

At 472, the SAR-ΔΣ control module 312, 360 determines whether another cycle for a current conversion is to be performed. If another cycle for a current conversion is to be performed, task 464 is performed, otherwise task 473 is performed. At 473, the SAR-ΔΣ control module 312, 360 outputs a digital signal representing a word converted by the SAR-ADC 300, 351.

At 474, the SAR-ΔΣ control module 312, 360 determines whether another conversion is to be performed. If conversion is to be performed, task 476 is performed, otherwise the method ends at 480. At 476, a conversion count is incremented by the SAR-ΔΣ control module 312, 360.

The above-described operations are meant to be illustrative examples; in one or more embodiments, the operations are performed sequentially, synchronously, simultaneously, continuously, during overlapping time periods or in a different order depending upon the application. Also, in one embodiment, one or more of the operations is not performed or skipped depending on the implementation and/or sequence of events.

Figure 13:
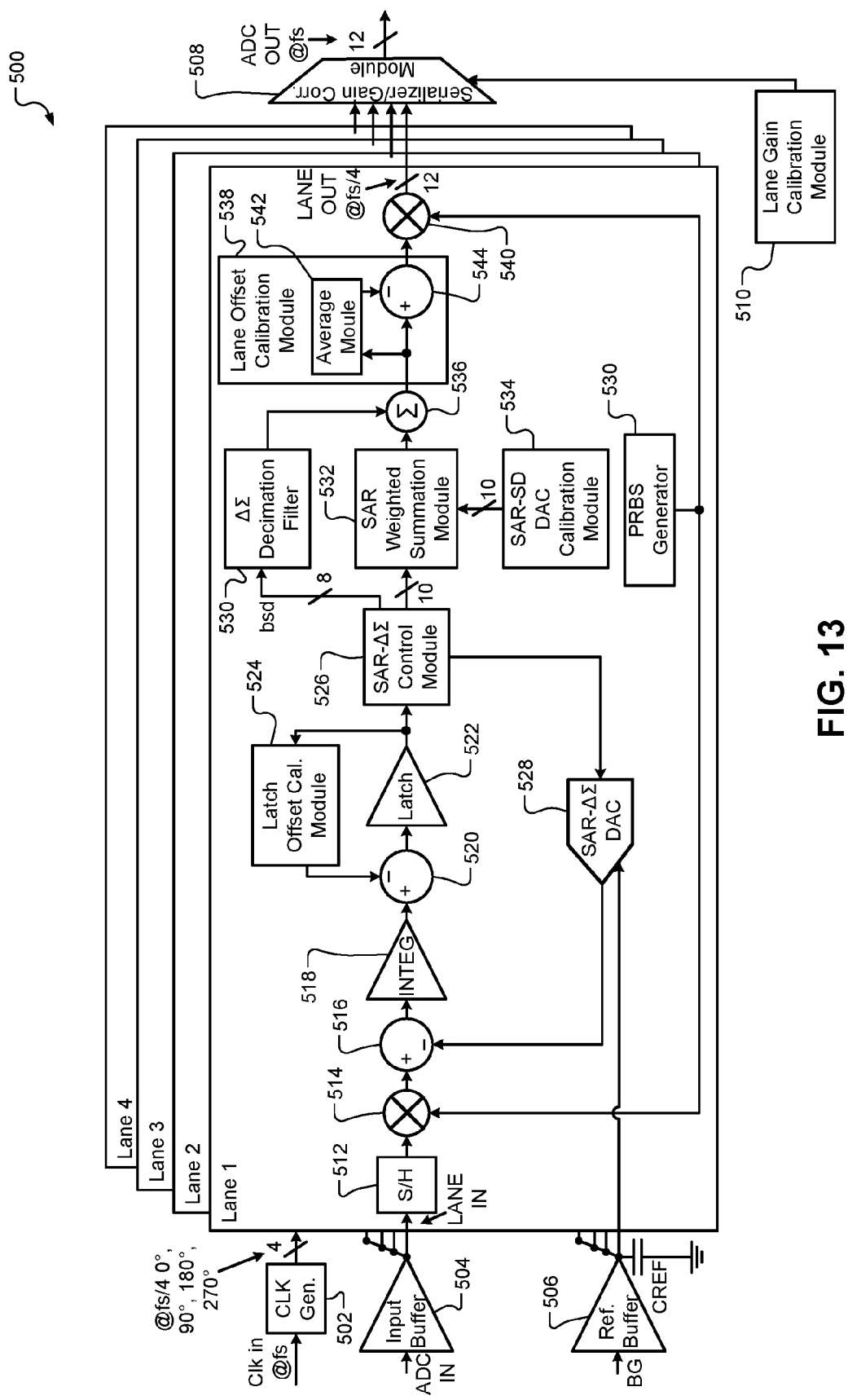
FIG. 13 is a block schematic view of an example of a 4-way interleaved SAR-ΔΣ ADC in accordance with an embodiment of the present disclosure.

The below described examples include a 12-bit 4-way interleaved ADC, which is shown in FIG. 13. The ADC performs, as an example, 600 mega-samples per second (MS/s) conversions. Although a 12-bit 4-way (i.e. 4 lanes) interleaved ADC is described, the aspects of the present disclosure are applicable to ADCs converting a different number of bits in parallel and having a different number of lanes.

FIG. 13 shows SAR-ΔΣ ADC 500 that includes a clock generator 502, an input buffer 504, a reference buffer 506, Lanes 1-4, a serializer and gain correction module 508 and a lane gain calibration module 510. The clock generator 502 receives a clock signal Clk at a resonant frequency fs and generates phase shifted clock signals for the lanes 1-4. The phase shifted clock signals have phases 0°, 90°, 180° and 270°, which are provided respectively to the lanes 1-4. The input buffer 504 receives an analog input signal ADC IN and provides the analog input signal ADC IN to the lanes 1-4. The reference buffer 506 receives a bandgap signal BG and provides the bandgap signal BG to the lanes 1-4. An output of the reference buffer is provided across a reference capacitor CREF.

Each of the lanes 1-4 includes a S/H circuit 512, a first multiplier 514, a first subtractor 516, an integrator 518, a second subtractor 520, a latch 522, a latch offset calibration module 524, a SAR-ΔΣ control module 526, and a SAR-ΔΣ DAC 528. The S/H circuit 512 samples the analog input voltage ADC IN. The multiplier 514 multiplies an output of the S/H circuit 512 and a pseudo-random bit sequence (PRBS) generated by a PRBS generator 530. The first subtractor 516 subtracts an output of the SAR-ΔΣ DAC 528 from an output of the multiplier 516. The integrator 518 integrates an output of the first subtractor 516. The second subtractor 520 subtracts an output of the latch offset calibration module 524 from an output of the integrator 518. The latch 522 latches an output of the second subtractor 520 and provides the latched output to the SAR-ΔΣ control module 526. The SAR-ΔΣ control module 526 and the SAR-ΔΣ DAC 528 are configured and/or operate similarly to (i) the SAR-ΔΣ control module 312 and the SAR-ΔΣ DAC 314 of FIG. 9, and/or (ii) the SAR-ΔΣ control module 360 and the hybrid DAC 354 of FIG. 11.

Each of the lanes 1-4 further include ΔΣ decimation module 530, a SAR weighted summation module 532, a SAR-SD DAC calibration module 534, a summer 536, a lane offset calibration module 538, and a second multiplier 540. The ΔΣ decimation module 530 filters a bit signal bsd out of the SAR-ΔΣ control module 526. The SAR weighted summation module 532 provides a weighted sum of the bit signals bsar received from the SAR-ΔΣ control module 360. The SAR-SD DAC calibration module 534 generates SAR weights, which are provided to the SAR weighted summation module 532, which performs the weighted summation based on the SAR weights. The summer 536 sums outputs of the ΔΣ decimation module 530 and the SAR weighted summation module 532.

The lane offset calibration module 538 includes an average module 542 and a third subtractor 544. The average module 542 averages outputs of the summer 536. The third subtractor 544 subtracts the average output of the average module 542 from the summation output of the summer 536. The second multiplier 540 multiples an output of the third subtractor 544 by the PRBS to provide a digital output. Digital outputs of the lanes 1-4 are provided to the serializer and gain correction module 508. The lane gain calibration module 510 generates a selection signal. The serializer and gain correction module 508 selects output of one of the lanes 1-4 based on the selection signal and adjusts gain of the selected output to provide an ADC output signal ADC OUT. In the example shown, the ADC output signal ADC OUT is a 12-bit digital signal. The serializer and gain correction module 508 serializes the parallel outputs of the lanes 1-4 to provide a serial signal (i.e. the ADC output signal ADC OUT).

The ADC architecture of FIG. 13 includes 4-way interleaved ADC lanes (i.e. lanes 1-4) driven at 25% duty-cycle for maximized input signal buffer loading. For each of the lanes 1-4 at start-up, an offset of the latch 522 is calibrated by the latch offset calibration module 524 to prevent incremental saturation of the SAR-ΔΣ ADC 500. Next the capacitive SAR-DAC is calibrated for linearity requirements. Finally, gain and offset mismatches among the lanes 1-4 are measured and correction coefficients are applied during operation. This is done by the lane offset calibration module 538. Slow offset mismatch variations are tracked and corrected.

Figure 14:
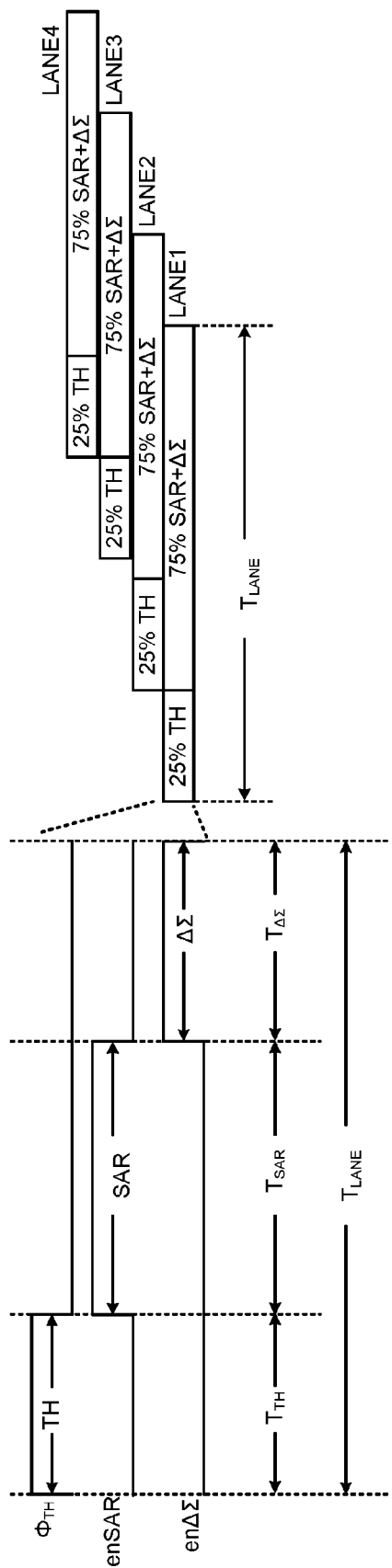
FIG. 14 is an example signal plot and a timing diagram for the ADC of FIG. 13.

FIG. 14 shows an example timing diagram of the signals $\Phi_{TH}$, enSAR, enΔΣ. FIG. 14 further shows an example of percentages of time associated with S/H operation versus SAR-ΔΣ DAC operation for each of the lanes 1-4 of FIG. 13. Offset operation of the lanes is also shown, which is due to the S/H timing associated with each bit of the lanes 1-4.

In this application and in one or more embodiments, including the definitions below, the term "module" or the term "controller" is replaced with the term "circuit." The term "module" refers to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

What is claimed is:

1. An analog-to-digital converter comprising:
   a sample and hold circuit configured to sample an analog input signal to generate a plurality of bits;
   a first analog-to-digital converter configured to generate a first digital signal based on the analog input signal, comprising
   a charge-sharing digital-to-analog converter configured to convert a first most-significant-bit of the plurality of bits, and
   a charge redistribution digital-to-analog converter configured to convert a first least significant bit of the plurality of bits,
   wherein the first digital signal is generated based on an output of the charge-sharing digital-to-analog converter and an output of the charge redistribution digital-to-analog converter;
   a second analog-to-digital converter configured to generate a second digital signal based on an output of the first analog-to-digital converter, wherein the second analog-to-digital converter comprises a delta sigma digital-to-analog converter, wherein the delta sigma digital-to-analog converter is configured to convert a second least significant bit of the plurality of bits, wherein the second digital signal is generated based on an output of the delta sigma digital-to-analog converter, and wherein the second analog-to-digital converter is a fine conversion analog-to-digital converter relative to the first analog-to-digital converter; and a combination circuit configured to combine the first digital signal and the second digital signal to provide a resultant output signal.

2. The analog-to-digital converter of claim 1, wherein:
the first analog-to-digital converter comprises a control module;
the control module is configured to perform successive approximations based on the plurality of bits to generate the first digital signal;
the second analog-to-digital converter comprises a decimation filter; and
the decimation filter is configured to suppress noise and output the second digital signal.

3. The analog-to-digital converter of claim 1, wherein:
the charge-sharing digital-to-analog converter is configured to (i) receive a digital input signal having an input voltage, and (ii) convert the first most-significant-bit of the plurality of bits of the digital input signal to be converted to an analog output signal;
the charge-sharing digital-to-analog converter comprises a first plurality of capacitors; and
the first plurality of capacitors are charged by the input voltage and reference voltages during a sampling phase of the digital input signal, wherein charges of the first plurality of capacitors are shared during successive approximations of a first one or more bits of the digital input signal received by the hybrid digital-to-analog converter to provide the analog output signal.

4. The analog-to-digital converter of claim 3, wherein:
the charge redistribution digital-to-analog converter is configured to convert the first least-significant-bit of the plurality of bits of the digital input signal to be converted to the analog output signal;
the charge redistribution digital-to-analog converter comprises a second plurality of capacitors;
the second plurality of capacitors are charged based on a common mode voltage during the sampling phase of the digital input signal; and
the charge redistribution digital-to-analog converter is configured to perform charge redistribution by connecting the second plurality of capacitors to receive the reference voltages during successive approximations of a second one or more bits of the digital input signal.

5. The analog-to-digital converter of claim 4, wherein:
the delta sigma digital-to-analog converter is configured to convert the second least-significant-bit of the plurality of bits to be converted to the analog output signal;
the delta sigma digital-to-analog converter comprises a third plurality of capacitors;
the third plurality of capacitors are charged based on the common mode voltage during the sampling phase of the digital input signal; and
the delta sigma digital-to-analog converter is configured to perform charge redistribution by connecting the third plurality of capacitors to receive the reference voltages during successive approximations of a third one or more bits of the digital signal.

6. The analog-to-digital converter of claim 1, wherein:
the charge-sharing digital-to-analog converter is configured to convert a plurality of most-significant-bits of the plurality of bits, wherein the plurality of most-significant-bits include the first most-significant-bit; and the charge redistribution digital-to-analog converter is configured to convert a plurality of least-significant-bits of the plurality of bits, wherein the plurality of least-significant-bits include the first least-significant-bit.

7. The analog-to-digital converter of claim 1, wherein:
the delta sigma digital-to-analog converter is configured to convert one or more least-significant-bits of the plurality of bits; and
the one or more least-significant-bits include the first least-significant-bit.

8. The analog-to-digital converter of claim 1, wherein the delta sigma digital-to-analog converter is configured to convert the first least significant bit, where the first least significant bit has a lowest corresponding order of magnitude of the plurality of bits.

9. A method comprising:
sampling an analog input signal to generate a plurality of bits;
generating a first digital signal based on the analog input signal via a first analog-to-digital converter, wherein generation of the first digital signal comprises
converting a first most-significant-bit of the plurality of bits via a charge-sharing digital-to-analog converter, and
converting a first least significant bit of the plurality of bits via a charge redistribution digital-to-analog converter,
wherein the first digital signal is generated based on an output of the charge-sharing digital-to-analog converter and an output of the charge redistribution digital-to-analog converter;
generating a second digital signal based on an output of the first analog-to-digital converter via a second analog-to-digital converter including converting a second least significant bit of the plurality of bits via a delta sigma digital-to-analog converter, wherein the second digital signal is generated based on an output of the delta sigma digital-to-analog converter, and wherein the second analog-to-digital converter is a fine conversion analog-to-digital converter relative to the first analog-to-digital converter; and
combining the first digital signal and the second digital signal to provide a resultant output signal.

10. The method of claim 9, further comprising:
performing successive approximations via the first analog-to-digital converter and based on the plurality of bits to generate the first digital signal; and
suppress noise of the first analog-to-digital converter and output the second digital signal via a decimation filter.

11. The method of claim 9, further comprising:
receiving a digital input signal having an input voltage via the charge-sharing digital-to-analog converter;
converting, via the charge-sharing digital-to-analog converter, the first most-significant-bit of the plurality of bits of the digital input signal to be converted to an analog output signal;
charging a first plurality of capacitors of the charge-sharing digital-to-analog converter by the input voltage and reference voltages during a sampling phase of the digital input signal; and
sharing charges of the first plurality of capacitors during successive approximations of a first one or more bits of the digital input signal received by the hybrid digital-to-analog converter to provide the analog output signal.

12. The method of claim 11, further comprising:
converting the first least-significant-bit of the plurality of bits of the digital input signal to be converted to the analog output signal via the charge redistribution digital-to-analog converter;
charging a second plurality of capacitors of the charge redistribution digital-to-analog converter based on a common mode voltage during the sampling phase of the digital input signal; and
performing charge redistribution, via the charge redistribution digital-to-analog converter, by connecting the second plurality of capacitors to receive the reference voltages during successive approximations of a second one or more bits of the digital input signal.

13. The method of claim 12, further comprising:
converting the second least-significant-bit of the plurality of bits to be converted to the analog output signal via the delta sigma digital-to-analog converter;
charging a third plurality of capacitors of the delta sigma digital-to-analog converter based on the common mode voltage during the sampling phase of the digital input signal; and
performing charge redistribution, via the delta sigma digital-to-analog converter, by connecting the third plurality of capacitors to receive the reference voltages during successive approximations of a third one or more bits of the digital signal.

14. An analog-to-digital converter comprising:
a digital-to-analog converter circuit configured to convert a plurality of bits of a digital signal to an analog signal;
a sample and hold circuit to sample an analog input signal;
a subtractor configured to subtract the analog signal from an output of the sample and hold circuit;
wherein the digital-to-analog converter circuit comprises
a first digital-to-analog converter configured to convert a first most-significant-bit of the plurality of bits,
a second digital-to-analog converter configured to convert a first least significant bit of the plurality of bits, and
a third digital-to-analog converter configured to convert a second least-significant-bit of the plurality of bits;
an amplifier configured to at least one of amplify or integrate an output of the digital-to-analog converter circuit;
a latch configured to latch an output of the amplifier; and
a successive approximation module configured to (i) receive an output of the latch, and (ii) perform successive approximations to generate the digital signal.

15. The analog-to-digital converter circuit of claim 14, wherein the amplifier is configured to amplify an output of the first digital-to-analog converter, an output of the second digital-to-analog converter and an output of the third digital-to-analog converter.

16. The analog-to-digital converter circuit of claim 14, wherein:
the first digital-to-analog converter is a charge sharing digital-to-analog converter; and
the second digital-to-analog converter is a charge redistribution digital-to-analog converter.

17. The analog-to-digital converter circuit of claim 14, wherein the third digital-to-analog converter is a delta sigma digital-to-analog converter.

18. The analog-to-digital converter circuit of claim 14, wherein:
the first digital-to-analog converter comprises a plurality of circuits corresponding to some of the plurality of bits;
each of the plurality of circuits is configured to convert a respective one of a plurality of most-significant-bits of the plurality of bits;
the plurality of most-significant-bits comprise the first most-significant-bit;
the second digital-to-analog converter comprises one or more circuits corresponding to one or more of the plurality of bits;
each of the one or more circuits is configured to convert a respective one of a plurality of least-significant-bits of the plurality of bits;
the plurality of least-significant-bits comprise the first least-significant-bit; and
the plurality of circuits do not include the one or more circuits.

19. The analog-to-digital converter circuit of claim 18, wherein the plurality of least-significant bits comprises the second least-significant bit.

20. The analog-to-digital converter circuit of claim 14, further comprising a capacitor, a switch and a NOR gate, wherein:
the amplifier comprises an integrator;
the capacitor is connected between an output of the integrator and a reference terminal; and
the switch is connected across the capacitor and receives a control signal from the NOR gate.

* * * * *